United States Patent
Paul et al.

(10) Patent No.: US 12,375,121 B2
(45) Date of Patent: Jul. 29, 2025

(54) FEEDBACK CONTROLLED HIGH-SPEED TRANSMITTER

(71) Applicant: Texas Instruments Incorporated, Dallas, TX (US)

(72) Inventors: Ankita Paul, Bangalore (IN); Lokesh Kumar Gupta, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 313 days.

(21) Appl. No.: 18/081,864

(22) Filed: Dec. 15, 2022

(65) Prior Publication Data

US 2024/0146353 A1 May 2, 2024

(30) Foreign Application Priority Data

Nov. 2, 2022 (IN) .............................. 202241062430

(51) Int. Cl.
*H04B 1/00* (2006.01)
*G06F 13/40* (2006.01)
(Continued)

(52) U.S. Cl.
CPC ........... *H04B 1/44* (2013.01); *G06F 13/4072* (2013.01); *H03F 3/45179* (2013.01);
(Continued)

(58) Field of Classification Search
CPC ... H04B 1/44; G06F 13/4072; H03F 3/45179; H03F 3/45668; H03F 3/245;
(Continued)

(56) References Cited

U.S. PATENT DOCUMENTS 7,804,351 B2 * 9/2010 Yamazaki ............ H03D 7/1441
455/323
9,837,965 B1 * 12/2017 Wagh .................... H03F 1/0227
(Continued)

OTHER PUBLICATIONS

"CAN physical layer for industrial applications," Public Available Specification CiA 102, V 3.0.0 (CAN in Automation, 2010), pp. 1-6.
(Continued)

*Primary Examiner* — Md K Talukder
(74) *Attorney, Agent, or Firm* — Mandy Barsilai Fernandez; Frank D. Cimino

(57) ABSTRACT

Differential signaling transmitter circuitry includes upper and lower driver stacks, each with at least one upper blocking transistor and a bias transistor, further includes first and second control loops. A first control loop includes a replica stack including replicas of the bias transistor and blocking transistors of a first one of the driver stacks, and a second control loop includes replica stacks, one with replicas of the bias and blocking transistors of the upper driver stack and one with replicas of the bias and blocking transistors of the lower driver stack. One of the replica stacks in the second control loop receives an output from the first control loop. First and second switching circuitry couples outputs of the first and second control loops to gates of bias transistor in the upper and lower driver stacks, respectively, responsive to a data signal.

20 Claims, 12 Drawing Sheets

(51) Int. Cl.
*H03F 3/45* (2006.01)
*H04B 1/44* (2006.01)
*H04L 12/40* (2006.01)

(52) U.S. Cl.
CPC ......... *H03F 3/45668* (2013.01); *H04L 12/40* (2013.01); *H04L 2012/40215* (2013.01)

(58) Field of Classification Search
CPC ................. H03F 3/45246; H04L 12/40; H04L 2012/40215; H04L 2012/40273
See application file for complete search history.

(56) References Cited

U.S. PATENT DOCUMENTS

| | | | |
|---|---|---|---|
| 11,128,261 B2* | 9/2021 | Ranta .................... | H03F 1/0227 |
| 2015/0270806 A1* | 9/2015 | Wagh ................. | H03F 3/45188 |
| | | | 330/296 |
| 2018/0262164 A1* | 9/2018 | Ranta ...................... | H03F 3/195 |
| 2018/0343161 A1* | 11/2018 | Gehring ................. | H04L 12/40 |
| 2020/0105317 A1* | 4/2020 | Venkatram .......... | G06F 13/1694 |
| 2021/0001788 A1 | 1/2021 | de Haas | |
| 2021/0167989 A1 | 6/2021 | Broughton et al. | |
| 2022/0209982 A1* | 6/2022 | Gehring ............ | H03K 17/6872 |

OTHER PUBLICATIONS

"TCAN1044V-Q1 Automotive Fault-Protected CAN FD Transceiver With 1.8-V I/O Support," Datasheet SLLSF17B (Texas Instruments Incorporated, Oct. 2021).

"THVD24x0 +/−70-V Fault-Protected 3.3-V to 5-V RS-485 Transceivers with IEC ESD," Datasheet SLLSF20B (Texas Instruments Incorporated, Oct. 2021).

International Search Report in corresponding PCT Application No. PCT/US2023/036664, mailed Feb. 28, 2024.

* cited by examiner

FEEDBACK CONTROLLED HIGH-SPEED TRANSMITTER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This disclosure relates to data communications, and more particularly relates to transmitter circuitry for high-speed balanced differential signaling in a high voltage environment.

Modern automobiles may incorporate as many as fifty or more computing devices, such as microprocessors and microcontrollers, for monitoring and controlling various functions. These functions include sophisticated engine control for attaining desired levels of performance, fuel economy, and environmental emission compliance, as well as advanced diagnostics, safety systems, comfort and convenience features, and the like. Electric and hybrid vehicles may also include processor and logic devices in the motor drive and charging subsystems. The distributed computing architecture implemented by these numerous computing devices has greatly reduced the amount of electrical wiring, and thus the weight, of the automobile.

The computing devices and subsystems within each vehicle communicate with one another to coordinate their operation. The Controller Area Network (CAN) standard (ISO 11898) and corresponding specifications (all of which are incorporated by reference in their entirety), promulgated by the International Standardization Organization (ISO) and adopted in the industry, specify a format and protocol for the communication of digital information among modules in a vehicle. The CAN standard defines a multi-master serial broadcast communications protocol in which the traditional automobile complex wiring harness is replaced by a two-wire bus. Because many of the messages communicated within a vehicle (e.g., measurements of temperature, RPM, etc.) are relatively short, communications under the CAN standard take the form of short messages broadcast over the entire network, as opposed to point-to-point transmission of large blocks of data under the supervision of a central bus master.

The CAN standard implements balanced, differential signaling in the transmission of binary data signals over the network, at data rates of up to, for example, 8 Mbps according to CAN FD standard ISO 11898-2 (incorporated herein by this reference). This differential signaling prevents the external coupling of noise in that the signals on each side of the differential pair (referred to as CANH and CANL) vary symmetrically, causing the combined noise contributions to destructively interfere. The high immunity to electrical interference provided by this signaling scheme, along with the ability to self-diagnose and repair data errors provided by the CAN standard, have led to the implementation of CAN networks in applications outside of the automotive sphere. For example, CAN networks are now also popular in a variety of industries including building automation, medical systems, and manufacturing operations.

Recently, a higher data rate version of the CAN standard, known as CAN XL, has been proposed, with expected data rates of up to and greater than 15 Mbps. In order to attain these higher data rates, many of the electrical specifications are significantly tightened for CAN XL as compared to the CAN FD standard. These specifications include tighter limits on the differential signaling voltage, including the limits for the high and low voltage levels, differential signaling voltage, and symmetry specifications.

Furthermore, because CAN networks are often implemented in automotive applications, CAN transceivers must be able to withstand high DC voltages (e.g., ±58V) on the CANH and CANL bus lines. Conventional CAN FD half-bridge drivers, such as the TCAN1044 and TCAN1062 CAN FD transceivers available from Texas Instruments Incorporated, include high voltage blocking transistors in the driver stack to provide this protection against these high DC bus voltages. CAN XL transceivers will be required to also tolerate these possible high DC bus line voltages.

In addition to these stringent specifications, the current draft specification for CAN XL requires differential signaling for both the dominant and the recessive signal phases, as compared with CAN FD in which a differential bus signal (bus line CANH high and bus line CANL low) is driven only in the dominant phase. Accordingly, a full H-bridge driver architecture is necessitated for CAN XL in order to drive both high and low voltage levels on both bus lines (CANH and CANL). While H-bridge driver architectures, such as that in the THVD24XX family of RS-485 transceivers available from Texas Instruments Incorporated, are known in the industry, the DC electrical specification limits for these devices are greatly relaxed as compared with those contemplated for CAN XL transmissions. For example, RS-485 communication standards do not specify a driver symmetry $V_{SYM}$ specification limit as stringent as the CAN standards.

It is within this context that the embodiments described herein arise.

BRIEF SUMMARY OF THE INVENTION

According to one aspect, transmitter circuitry including upper and lower driver stacks, each with at least one upper blocking transistor and a bias transistor, further includes first and second control loops. A first control loop includes a replica stack including replicas of the bias transistor and blocking transistors of a first one of the driver stacks, and a second control loop includes replica stacks, one with replicas of the bias and blocking transistors of the upper driver stack and one with replicas of the bias and blocking transistors of the lower driver stack. One of the replica stacks in the second control loop receives an output from the first control loop. First and second switching circuitry couples outputs of the first and second control loops to gates of bias transistor in the upper and lower driver stacks, respectively, responsive to a data signal.

According to another aspect, differential signaling transmitter circuitry includes a first including a first bias transistor having a source/drain path coupled to a first terminal in series with the source/drain path of at least one first blocking transistor in the first driver stack, and a second including a second bias transistor having a source/drain path coupled to a second terminal in series with the source/drain path of at least one second blocking transistor. The circuitry further includes first replica circuitry adapted to generate a first bias reference voltage by controlling a gate voltage of a replica of the first bias transistor in a first replica stack, the first replica stack also including replicas of the at least one first blocking transistor in the first driver stack, so that a current conducted by the first replica stack matches a current conducted by a first resistor. Second replica circuitry is adapted to generate a second bias reference voltage by controlling a gate voltage of a replica of the second bias transistor in a second replica stack, the second replica stack including the replica of the second bias transistor and replicas of the at least one second blocking transistor in the second driver stack, the second replica stack coupled in series with a third replica stack including replicas of the first bias transistor and replicas of the at least one first blocking transistor in the first driver stack, the gate of the replica of the first bias transistor in the third replica stack receiving the gate voltage controlled by the first replica circuitry, so that a current conducted by the second replica stack matches a current conducted by first and second resistors connected in series. First and second switching circuitry is provided to couple first and second gate voltages, corresponding to the first and second bias reference voltages, respectively, to the first and second bias transistors, respectively, responsive to a data signal.

According to another aspect, a network node includes a microcontroller unit, receiver circuitry, and transmitter circuitry, where the transmitter circuitry includes upper and lower driver stacks, each with at least one upper blocking transistor and a bias transistor, further includes first and second control loops. A first control loop in the transmitter circuitry includes a replica stack including replicas of the bias transistor and blocking transistors of a first one of the driver stacks, and a second control loop includes replica stacks, one with replicas of the bias and blocking transistors of the upper driver stack and one with replicas of the bias and blocking transistors of the lower driver stack. One of the replica stacks in the second control loop receives an output from the first control loop. First and second switching circuitry in the transmitter circuitry couples outputs of the first and second control loops to gates of bias transistor in the upper and lower driver stacks, respectively, responsive to a data signal from the microcontroller unit.

Technical advantages enabled by one or more of these aspects include the ability to transmit high data rate differential signaling for both dominant and recessive phases at high stable and symmetric levels over variations in manufacturing process parameters, voltage, and temperature. Tolerance of high DC levels at the bus lines can be provided, while adding little bus capacitance.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF THE INVENTION

The example embodiments described in this specification are implemented into a Controller Area Network (CAN) transceiver, such as may be implemented in an automobile or other vehicle, as it is contemplated that such implementation is particularly advantageous in that context. However, it is also contemplated that aspects of these embodiments may be beneficially applied in other applications, for example in other CAN implementations as well as with other physical layer protocols utilizing similar signaling. Accordingly, it is to be understood that the following description is provided by way of example only and is not intended to limit the true scope of this invention as claimed.

Figure 1A:
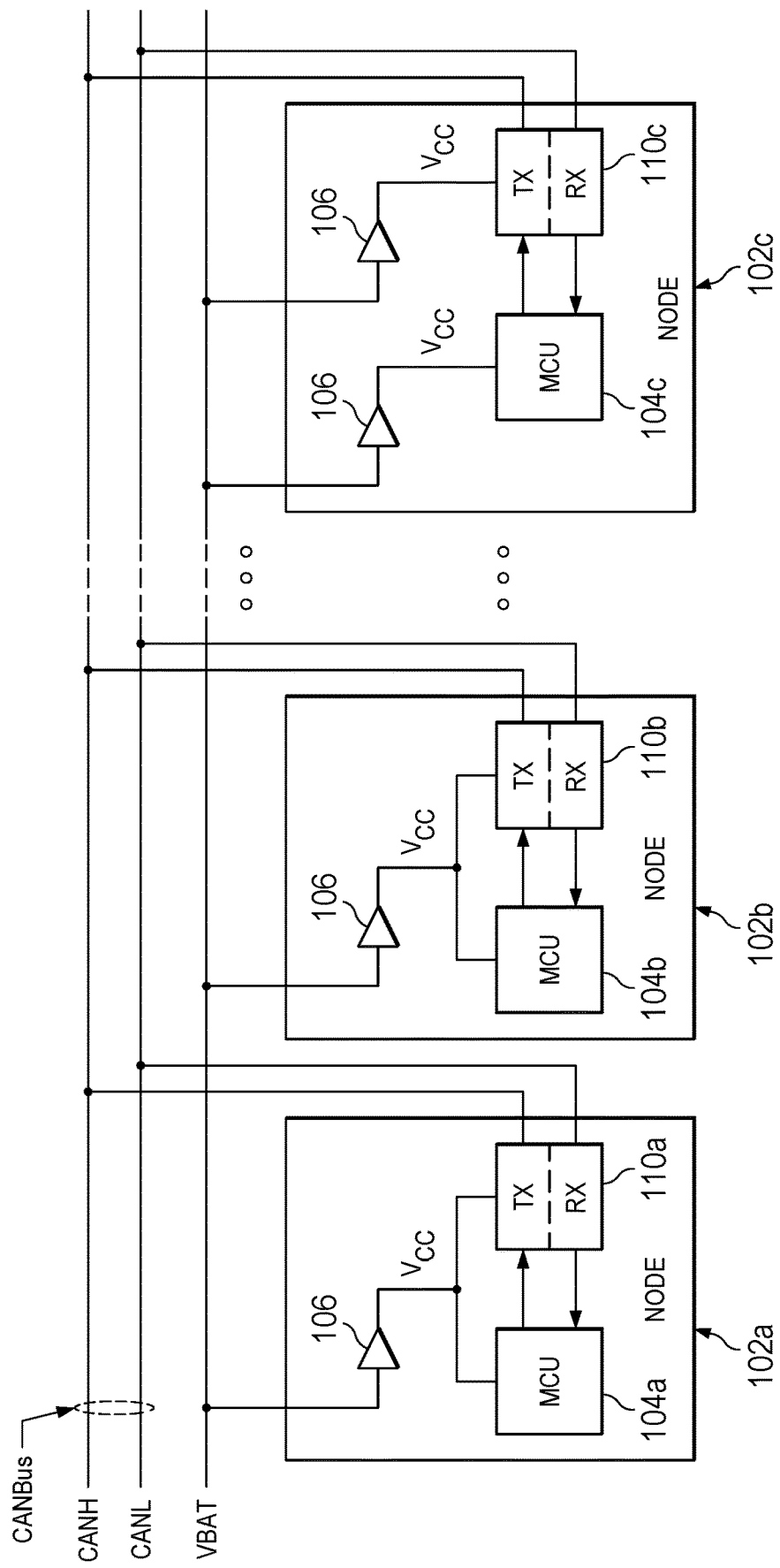
FIG. 1A is an electrical diagram, in block form, of a controller area network (CAN) according to example embodiments.

FIG. 1A illustrates a generalized architecture of a Controller Area Network (CAN), for example as may be implemented according to draft specification CiA 610-3 promulgated by the CAN in Automation (CiA) association, incorporated herein by reference, and commonly referred to as the CAN XL standard for intra-vehicle communication. As shown in FIG. 1A, bus CANBus is a two wire bus including wires CANH and CANL, over which data signals are serially communicated among network nodes 102a, 102b, 102c (generically referred to as node or nodes 102). Nodes 102 correspond to sensors, controllers, and/or other electronic subsystems within the vehicle, and may be distributed throughout the vehicle. Each node 102 may include either or both digital circuitry, including for example custom or programmable computational logic, and analog circuitry, arranged in the desired architecture. In this example, each node 102a, 102b, 102c includes a corresponding microcontroller unit (MCU) 104a, 104b, 104c, respectively. Each MCU 104a, 104b, 104c (individually or collectively referred to as MCU or MCUs 104) is coupled to a respective transceiver 110a, 110b, 110c (individually or collectively referred to as transceiver or transceivers 110) in its node 102. As shown in FIG. 1, each transceiver 110a, 110b, 110c is coupled to wires CANH, CANL of bus CANBus. Each of nodes 102 include one or more voltage regulators 106 that generates a power supply voltage $V_{CC}$ from the external voltage on line VBAT for use internally to the node. In some cases, as shown for node 102c in FIG. 1, multiple voltage regulators 106 may be included if different power supply voltages $V_{CC}$ are to be supplied to different functions within the node (e.g., MCU 104c biased by $V_{CC}$=5 V while transceiver 110c is biased by $V_{CC}$=3 V).

Each transceiver 110 is constructed and operates to transmit and receive signals (e.g., data, command signals, control signals and/or instructions) to and from other nodes 102 in the network, via their transceivers 110. In this example, data and control signals are communicated between each transceiver 110a, 110b, 110c and its corresponding MCU 104a, 104b, 104c, such data and control signals including signals from MCU 104 to control its associated transceiver 110 to transmit a corresponding dominant or recessive state on bus CANBus, and including signals from transceiver 110 to its associated MCU 104 indicating the sensing of a dominant or recessive state at bus CANBus.

In some implementations, other functions may also reside on bus CANBus. For example, in some vehicles, a gateway (not shown in FIG. 1A) may be provided on bus CANBus for communication with external systems, such as through an on-board diagnostic (OBD) port. According to the CiA 610-3 draft standard, the CAN network operates as a multi-master, message broadcast system, in that any of network nodes 102a, 102b, 102c can serve as the bus master for communications with one or more of the other nodes 102 using broadcast messaging.

Figure 1B:
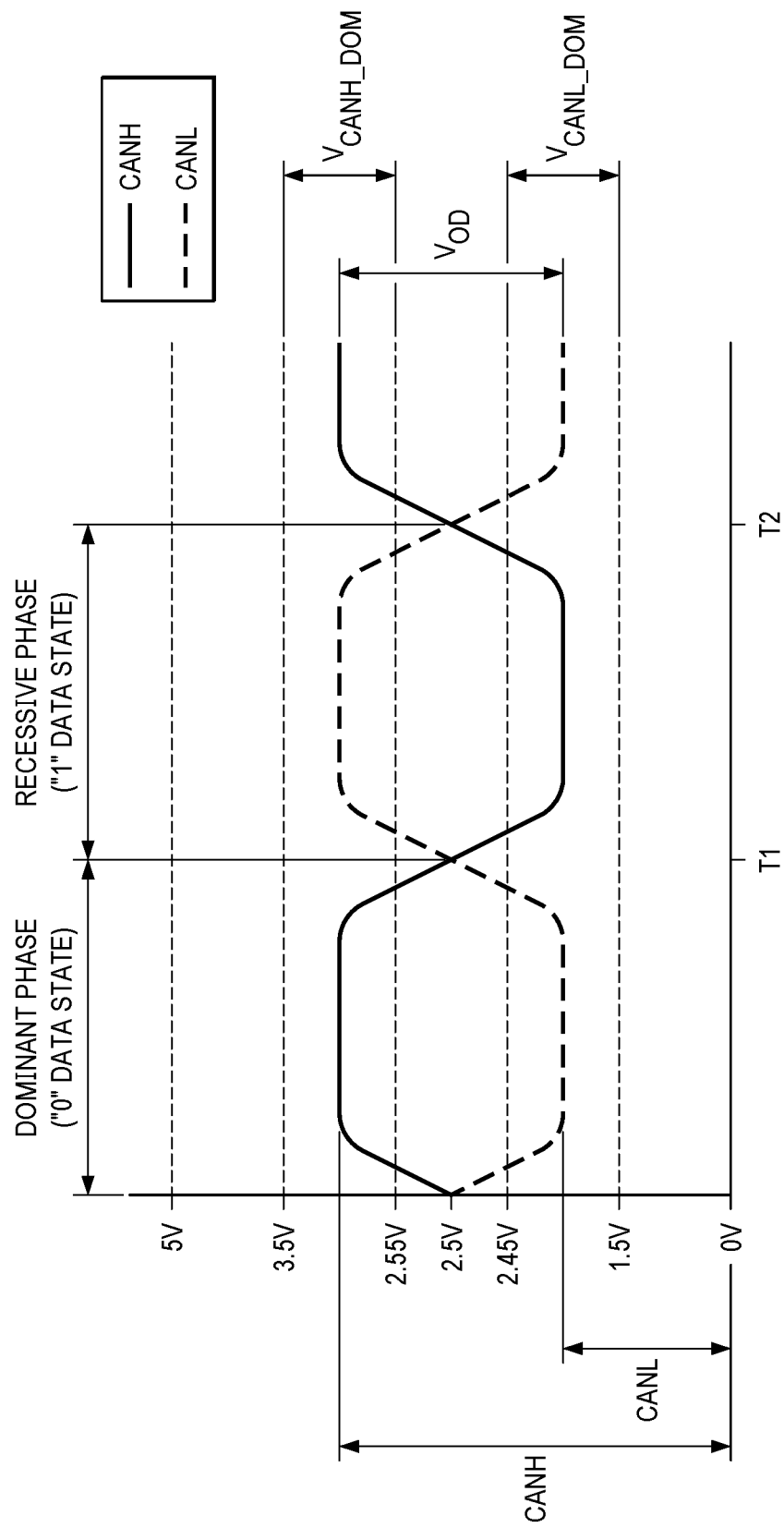
FIG. 1B is a timing diagram illustrating data phases at bus lines in a CANXL network.

FIG. 1B illustrates the physical layer data signaling protocol according to current CAN XL specifications, as applied to bus CANBus in FIG. 1A. The CAN XL draft standard CiA 610-3 implements balanced differential signaling, with bus lines CANH, CANL driven to differential voltages of a selected polarity to indicate the "dominant" and "recessive" differential states, corresponding to the binary digital values "0" and "1", respectively. As shown in FIG. 1B, the dominant phase ("0" data state) under CAN XL is communicated on bus CANBus by a differential voltage of a polarity with bus line CANH at a higher voltage than line CANL, while the recessive phase ("1" data state) is communicated by a differential voltage of the opposite polarity, with bus line CANL at a higher voltage than line CANH. This differential signaling under CAN XL differs from that of the CAN FD standard, in which the recessive ("1" data level) state is communicated on bus CANBus by driver circuitry presenting a high impedance to lines CANH, CANL, while a common mode voltage buffer in the receiver circuitry of each node biases both of lines CANH, CANL to a common mode voltage.

Figure 2:
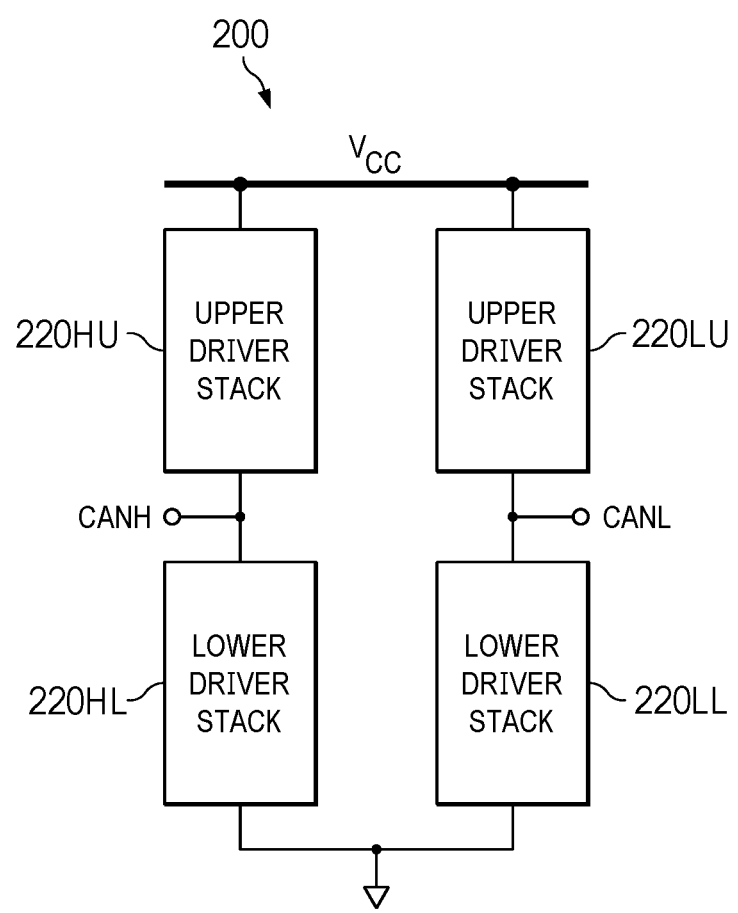
FIG. 2 is an electrical diagram, in block form, of data driver circuitry in a transceiver of a network node in the CANXL network of FIG. 1A according to an example embodiment.

FIG. 2 illustrates a generalized architecture of H-bridge driver 200 suitable for CAN XL differential signaling, into which example embodiments may be implemented. As shown in FIG. 2, bus line CANH is driven by upper stack 220HU and lower stack 220HL, and bus line CANL is driven by upper stack 220LU and lower stack 220LL. Upper stack 220HU is coupled between a supply node configured to receive a power supply voltage $V_{CC}$ and bus line CANH, and lower stack 220HL is coupled between bus line CANH and a common node or potential (e.g., circuit ground). Similarly, upper stack 220LU is coupled between power supply voltage $V_{CC}$ and bus line CANL, and lower stack 220LL is coupled between bus line CANL and the common potential. In operation, the dominant phase will be driven onto bus CANbus by upper stack 220HU and lower stack 220LL both turned on, and lower stack 220HL and upper stack 220LU turned off. Conversely, the recessive phase is driven by upper stack 220LU and lower stack 220HL both turned on, and lower stack 220LL and upper stack 220HU turned off.

In order to attain higher data rates under the CAN XL standard, many of the electrical specifications are significantly tightened. Table 1 shows some of the differences in certain electrical standards between the CAN FD standard (ISO 11898-2) and the draft CAN XL standard (CiA 610-3).

TABLE 1

| Specification | CAN FD (ISO 11898-2) | CAN XL (CiA 610-3) |
|---|---|---|
| $V_{OD}$ | 1.5-3.0 V | 0.6-1.5 V |
| $V_{SYM}$ | 0.9-1.1 V | 0.95-1.05 V |
| $V_{CANH\_DOM}$ (also $V_{CANL\_REC}$) | 2.75-4.5 V | 2.55-3.5 V |
| $V_{CANH\_REC}$ (also $V_{CANL\_DOM}$) | 0.5-2.25 V | 1.5-2.45 V |
| Data rate | <8 Mbps | >15 Mbps |

As illustrated in FIG. 1B, VOD refers to the differential voltage between the CANH and CANL bus lines in each of the two data states. $V_{CANH\_DOM}$ refers to the voltage at bus line CANH in the dominant phase, while $V_{CANL\_DOM}$ refers to the voltage at bus line CANL in the dominant phase; these same voltage limits conversely apply as the bus line voltages $V_{CANH\_REC}$ and $V_{CANH\_REC}$ in the recessive phase. The specification Von indicates the required driver symmetry in both of the dominant and recessive phases, defined as the ratio of the sum of the voltages driven at bus lines CANH and CANL to the power supply voltage $V_{CC}$:

$$(V_{O(CANH)}+V_{O(CANL)})/V_{CC} \qquad (1)$$

This driver symmetry specification is to be met in both the dominant and recessive phases. As indicated in Table 1, these specifications for CAN XL are significantly tighter than the corresponding specification limits in the CAN FD standard.

Particularly in automotive applications, CAN transceivers are required to withstand high DC voltages on the differential signaling lines (CANH, CANL), for example bus voltages $V_{BUS}$ from −58 V to +58 V, and maximum differential voltage VDIFF across lines CANH, CANL from −45 V to +45 V. As such, CAN transmitters commonly include high voltage blocking diodes, implemented for example as high voltage metal oxide semiconductor (MOS) transistors, for protecting switching transistors from high DC voltages of both positive and negative polarities. However, the on resistance ($R_{on}$) of these high voltage MOS transistors varies with manufacturing process parameters, power supply voltage, and temperature (such variations commonly referred to as "PVT"). This variation of on resistance $R_{on}$ over PVT renders conventional driver stack designs, such as those currently used in single-stack CAN FD drivers, unable to meet the tighter CAN XL specification requirements over the specified voltage and temperature ranges and over expected process variations.

CAN transceivers with CAN XL capability will be expected to operate both according to the CAN XL standard and also according to the CAN FD standard, as CAN FD signaling is used in the bus arbitration phase under CAN XL. In addition, it will be useful for CAN XL-capable transceivers to be backward-compatible with legacy CAN FD networks. Accordingly, it is contemplated that transceivers will incorporate H-bridge transmitter drivers for CAN XL communications in parallel with single-ended stack transmitter drivers operable for CAN FD communications. However, CAN standards specify a maximum bus capacitance of 50 pF per network node, which applies to the sum of the driver capacitances of the parallel CAN FD and CAN XL transceivers. This tightly constrains the CAN XL transmitter design, considering that a conventional CAN FD driver itself commonly presents a bus capacitance of on the order of 40 pF.

Figure 3:
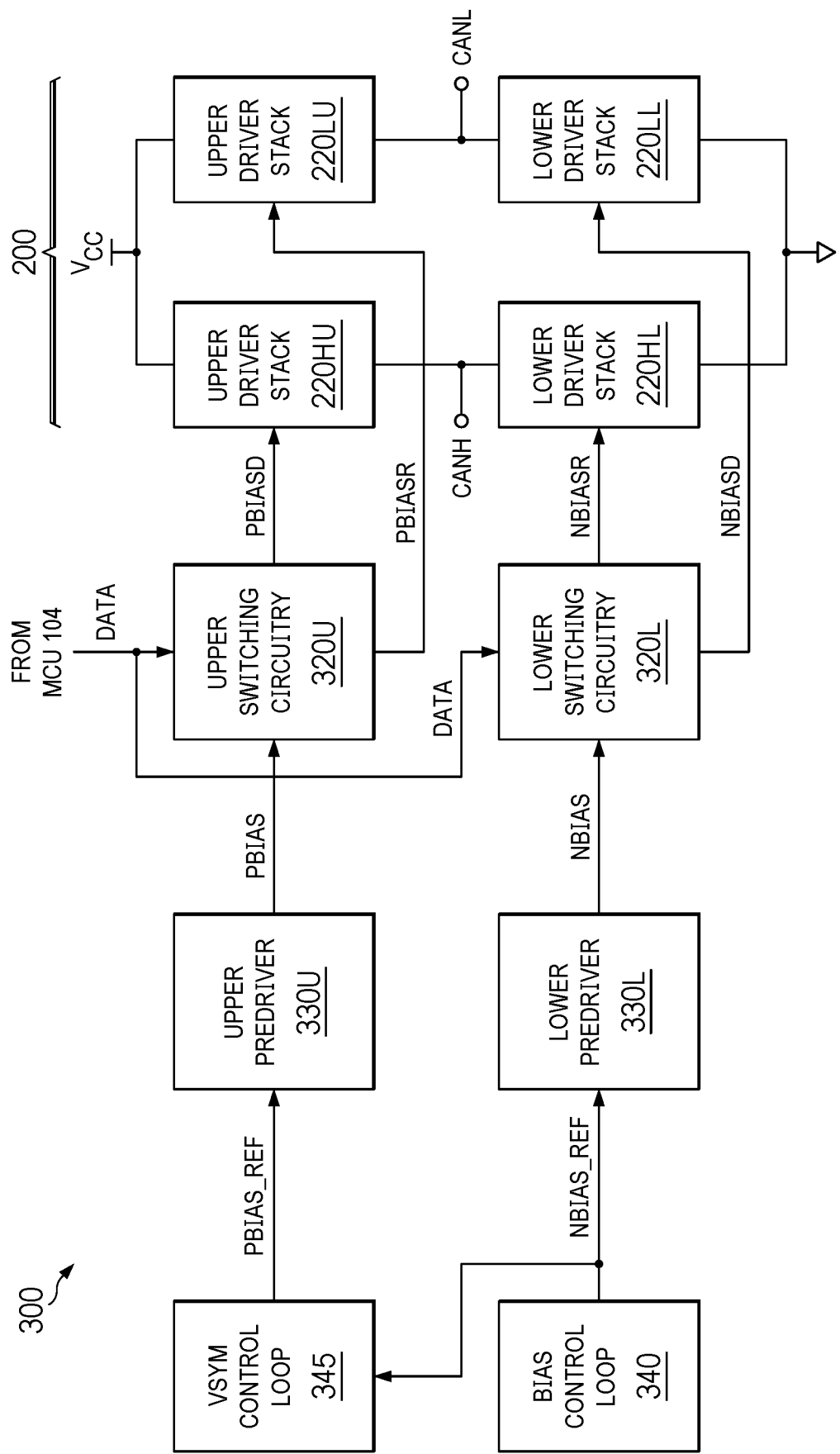
FIG. 3 is an electrical diagram, in block form, of transmitter circuitry in a transceiver of a network node in the CANXL network of FIG. 1A according to an example embodiment.

FIG. 3 illustrates the architecture of transmitter circuitry 300 suitable for differential signaling onto bus lines CANH, CANL, and constructed according to example embodiments. In the network architecture of FIG. 1A, transmitter circuitry 300 will be implemented (along with corresponding receiver circuitry) in transceiver 110 for a given network node 102. As described above relative to FIG. 2, H-bridge driver 200 of transmitter circuitry 300 has outputs at bus lines CANH, CANL. Upper driver stack 220HU has an input coupled to upper switching circuitry 320U to receive bias voltage PBIASD in the dominant phase, while lower driver stack 220LL has an input coupled to lower switching circuitry 320L to receive bias voltage NBIASD, also in the dominant phase. Conversely, upper driver stack 220LU has an input coupled to upper switching circuitry 320U to receive bias voltage PBIASR in the recessive phase, and lower driver stack 220HL has an input coupled to lower switching circuitry 320L to receive bias voltage NBIASR, also in the recessive phase.

For the application of transmitter circuitry 300 in a CAN XL network, the applicable symmetry specifications require the high bus voltages $V_{CANH\_DOM}$ and $V_{CANL\_REC}$ in the dominant and recessive phases to be substantially equal to one another, and the low bus voltages $V_{CANL\_DOM}$ and $V_{CANH\_REC}$ in the dominant and recessive phases to also be substantially equal to one another. Accordingly, the bias voltages PBIASD and PBIASR generated from upper switching circuitry 320U are substantially equal to one another, and the bias voltages NBIASD and NBIASR generated from lower switching circuitry 320L are also substantially equal to one another.

Upper switching circuitry 320U and lower switching circuitry 320L each receive data signals on line DATA from MCU 104 in its network node 102, and operate to generate and forward the appropriate bias voltages PBIASD, PBIASR, NBIASD, NBIASR to driver 200 depending on the data state to be driven. According to this example embodiment, these bias voltages PBIASD, PBIASR, NBIASD, NBIASR are at levels controlled by bias control loop 340 and VSYM control loop 345. In the example of FIG. 3, bias control loop 340 generates bias reference voltage NBIAS_REF, and VSYM control loop 345 generates bias reference voltage PBIAS_REF based in part on bias reference voltage NBIAS_REF from bias control loop 340.

Alternatively, the placement of bias control loop 340 and VSYM control loop 345 may be reversed from that shown in FIG. 3. In this alternative implementation, bias control loop 340 generates bias reference voltage PBIAS_REF, while VSYM control loop 345 generates bias reference voltage NBIAS_REF based in part on bias reference voltage PBIAS_REF as generated by bias control loop 340 in this example.

In the example shown in FIG. 3 in which bias control loop 340 generates bias reference voltage NBIAS_REF, an output of bias control loop 340 is coupled to an input of bias reference voltage NBIAS_REF to lower pre-driver 330L, and an output of VSYM control loop 345 is coupled to an input of upper predriver 330U. Upper predriver 330U buffers bias reference voltage PBIAS_REF to a bias voltage PBIAS at its output, which is coupled to an input of upper switching circuitry 320U. Similarly, lower predriver 330L buffers bias reference voltage NBIAS_REF to a bias voltage NBIAS at its output, which is coupled to an input of lower switching circuitry 320L. In this example, as will be described below, pre-drivers 330U, 330L are constructed as unity gain amplifiers arranged as voltage followers, for example with a "Class AB" output stage, and as such the bias voltages output by pre-drivers 330U, 330L are at the same voltages as bias reference voltages PBIAS_REF, NBIAS_REF generated from VSYM control loop 345 and bias control loop 340, respectively. Alternatively, pre-drivers 330U and 330L can be constructed to apply a gain other than unity if desired.

According to example embodiments, bias voltages NBIASR, NBIASD applied to lower driver stacks 220HL, 220LL by lower switching circuitry 320L are controlled by bias control loop 340, to compensate for variations in the on resistance $R_{on}$ of transistors in lower driver stacks 220HL, 220LL. According to this example embodiment, bias control loop 340 generates this compensated bias reference voltage NBIAS_REF based on its construction, which includes replicas of devices in lower driver stacks 220HL, 220LL, Similarly, bias voltages PBIASR, PBIASD applied to upper driver stacks 220HU, 220LU are controlled by VSYM control loop 345 to compensate for variations in the on resistance $R_{on}$ of transistors in the full driver stacks of upper and lower driver stacks 220HU and 220HL, and upper driver stack 220LU and lower driver stack 220LL. VSYM control loop 345 is constructed to include replicas of devices in upper driver stack 220HU and lower driver stack 220HL (which match the devices in driver stacks 220LU and 220LL, respectively).

Figure 4:
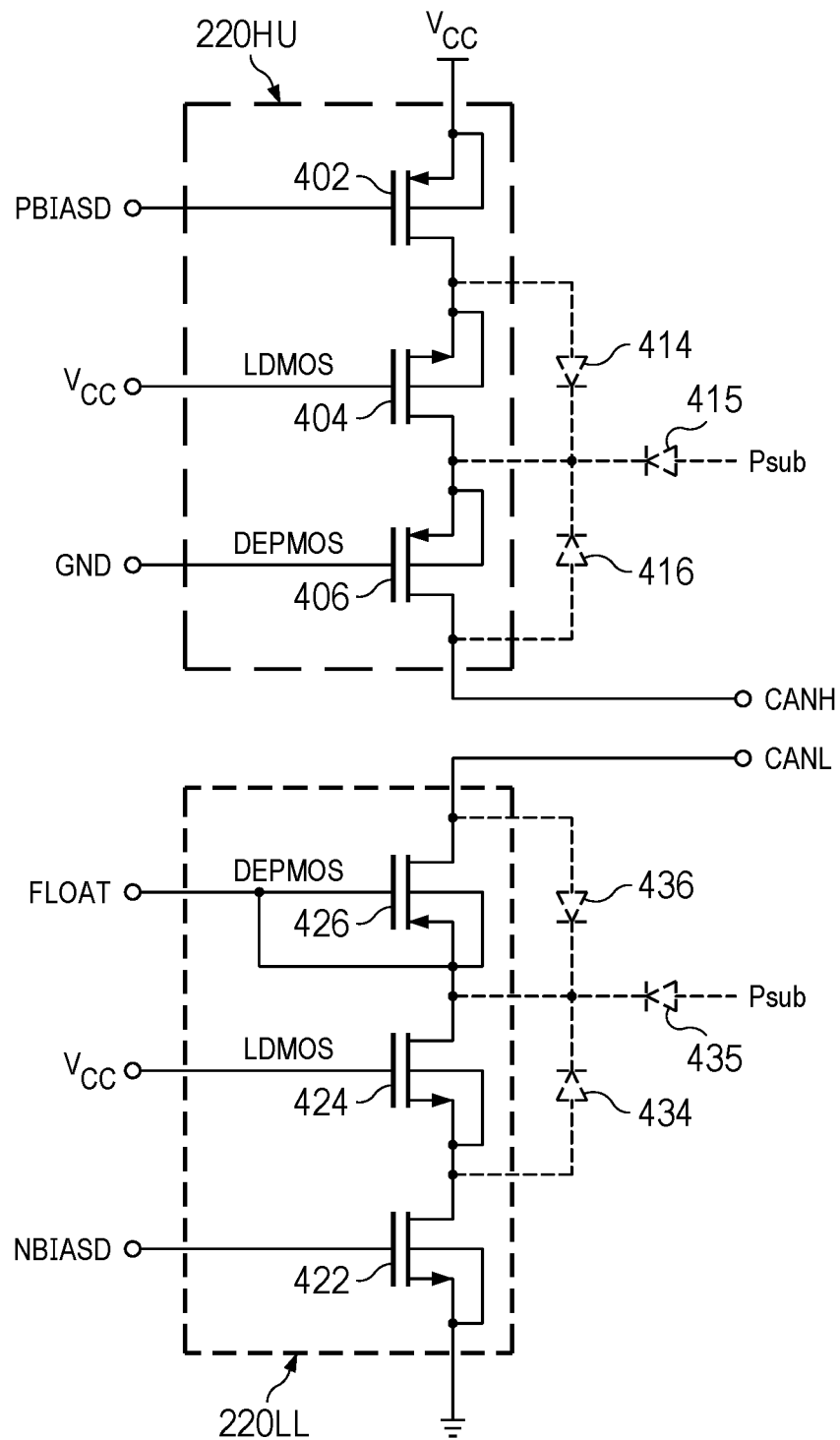
FIG. 4 is an electrical diagram, in schematic form, of one pair of driver stacks in the transmitter circuitry of FIG. 3 according to an example.

FIG. 4 illustrates the construction of upper driver stack 220HU and lower driver stack 220LL according to an example embodiment. As noted above, upper driver stack 220HU and lower driver stack 220LL operate to drive voltages on bus lines CANH, CANL, respectively, in the dominant phase of differential signaling output by transmitter circuitry 300. In this implementation, upper driver stack 220LU and lower driver stack 220HL, which drive bus lines CANH, CANL, respectively, in the recessive phase, are constructed similarly as shown in FIG. 4.

Upper driver stack 220HU in this example includes p-channel metal-oxide-semiconductor (PMOS) transistor 402 with its source coupled to the $V_{CC}$ power supply node, and a gate receiving bias voltage PBIASD from upper switching circuitry 320U. PMOS transistor 402 in this example is constructed as a low voltage (e.g., 5 V) transistor, and operates in the dominant phase in response to the level of bias voltage PBIASD to control the voltage appearing at bus line CANH. In the recessive phase, as will be described below, bias voltage PBIASD will be at a level that turns off PMOS transistor 402 (e.g., $V_{CC}$).

The drain of PMOS transistor 402 is coupled to the source of high voltage n-channel MOS (NMOS) transistor 404. The gate of NMOS transistor 404 is coupled to the $V_{CC}$ power supply node. In this example, NMOS transistor 404 is constructed to tolerate high voltages appearing across its drain-to-source path, such as may be specified under the CAN XL standards (e.g., ±58V). For example, NMOS transistor 404 may be constructed as a laterally-diffused MOS (LDMOS) transistor. The drain of NMOS transistor 404 is coupled to the source of PMOS transistor 406. PMOS transistor 406 has its gate biased at circuit ground, and its drain coupled to bus line CANH. In this example, PMOS transistor 404 is constructed to tolerate high voltages appearing across its drain-to-source path, for example as a drain-extended PMOS (DEPMOS) transistor. The body node is source-connected in each of transistors 402, 404, 406.

According to this arrangement and gate bias of high voltage NMOS transistor 404 and high voltage PMOS transistor 406 in upper driver stack 220HU according to this example embodiment, conduction between bus line CANH and the $V_{CC}$ power supply node is blocked for both positive and negative high voltages, thus protecting PMOS transistor 402. As shown in FIG. 4, the drain and source of NMOS transistor 404 constitute an anode and cathode, respectively, of a blocking diode 414. This blocking diode 414 is reverse-biased in the event of a positive high voltage at bus line CANH. Conversely, the drain and source of PMOS transistor 406 constitute an anode and cathode, respectively, of a blocking diode 416. This blocking diode 416 is reverse-biased in the event of a negative high voltage at bus line CANH. In this implementation, transmitter circuitry 300 is fabricated at a surface of p-type substrate (Psub), such that a p-n junction is present between the n-type drain of NMOS transistor 404 and p-type substrate Psub. This junction constitutes substrate diode 415 as shown in FIG. 4, with its anode at substrate Psub and cathode at the drain of NMOS transistor 404. Because NMOS transistor 404 is coupled to bus line CANH through PMOS transistor 406, blocking diode 416 blocks conduction from high negative voltage at bus line CANH not only to power supply node $V_{CC}$ but also to substrate Psub. Substrate diode 415 is reverse biased in the event of high positive voltage at bus line CANH, preventing conduction to substrate.

Conversely, lower driver stack 220LL in this example includes NMOS transistor 422 with its source coupled to circuit ground, and its gate receiving bias voltage NBIASD from lower switching circuitry 320L. As in the case of PMOS transistor 402, NMOS transistor 422 is also constructed as a low voltage (e.g., 5 V) transistor, and operates in the dominant phase to control the voltage appearing at bus line CANL. In the recessive phase, bias voltage NBIASD will be at a level that turns off NMOS transistor 422 (e.g., circuit ground).

The drain of NMOS transistor 422 is coupled to the source (and body node) of high voltage NMOS transistor 426, which has its gate coupled to the $V_{CC}$ power supply node. Similarly, as high voltage NMOS transistor 404, NMOS transistor 424 is constructed as a high voltage tolerant device, for example as an LDMOS transistor. The drain of NMOS transistor 424 is coupled to the source (and body node) of high voltage PMOS transistor 426. In contrast to upper driver stack 220HU, PMOS transistor 426 has its gate (and body node) coupled to its source at the drain of NMOS transistor 426. The gate of PMOS transistor 426 is otherwise floating. PMOS transistor 426 is thus "diode-connected," and thus behaves electrically in similar fashion as a diffused or other diode. The drain of PMOS transistor 426 is coupled to bus line CANL. PMOS transistor 426 is constructed as a high voltage device, for example as a DEPMOS transistor.

As in upper driver stack 220HU, conduction between bus line CANH and the common potential (e.g., circuit ground) is blocked in lower driver stack 220LL for both positive and negative high voltages, thus protecting NMOS transistor 422. Diode-connected PMOS transistor 426 establishes a negative high voltage blocking diode 436 with its anode at bus line CANL and its cathode at the drain of NMOS transistor 424. This blocking diode 436 is reverse-biased in the event of a positive high voltage at bus line CANL. NMOS transistor 434 establishes a positive high voltage blocking diode 434 with its cathode at the source of diode-connected PMOS transistor 426, and its anode at the drain of NMOS transistor 422. As such, this blocking diode 434 is reverse-biased in the event of a negative high voltage at bus line CANH. Similarly, as upper driver stack 220HU, a substrate diode 435 is present at the p-n junction between the n-type drain of NMOS transistor 424 and p-type substrate Psub in this implementation. This substrate diode 435 is reverse biased in the event of high positive voltage at bus line CANL to prevent conduction to substrate, but is not forward-biased in the event of high negative voltage at bus line CANL due to the blocking action of PMOS transistor 426.

The diode-connected configuration of PMOS transistor 426 in lower driver stack 220LL in this example embodiment reduces the variation in resistance of the driver stacks over temperature in H-bridge driver 200. In particular, because PMOS transistor 426 is diode-connected, the on resistance $R_{on}$ presented by diode-connected PMOS transistor 426 is complementary to absolute temperature (CTAT). This CTAT behavior of PMOS transistor 426 serves to compensate for the proportional to absolute temperature (PTAT) behavior of on resistance $R_{on}$ of NMOS transistor 424, which is configured as a "switch" (e.g., as an NMOS transistor receiving a gate voltage of $V_{CC}$). In the upper driver stack 220HU, the drain-to-source voltage ($V_{ds}$) of NMOS transistor 404, which is acting as a diode with $V_{CC}$ at its gate, is CTAT, which opposes the PTAT behavior of the on resistance $R_{on}$ of PMOS transistor 406. The compensation provided by this CTAT behavior of diode-connected PMOS transistor 426 in lower driver stack 220LL, according to this example embodiment, thus serves to limit variation in differential voltage VOL) over temperature.

According to example embodiments, lower replica stack 520 in bias control loop 340 is constructed to include replicas of the devices in lower driver stack 220LL (and the devices in similarly-constructed lower driver stack 220HL). Based on these replicas, bias control loop 340 generates and adjusts bias reference voltage NBIAS_REF in a manner that reduces variations in the voltages driven on bus lines CANH, CANL as the on resistance $R_{on}$ of devices in lower driver stacks 220HL, 220LL varies over PVT.

Figure 5A:
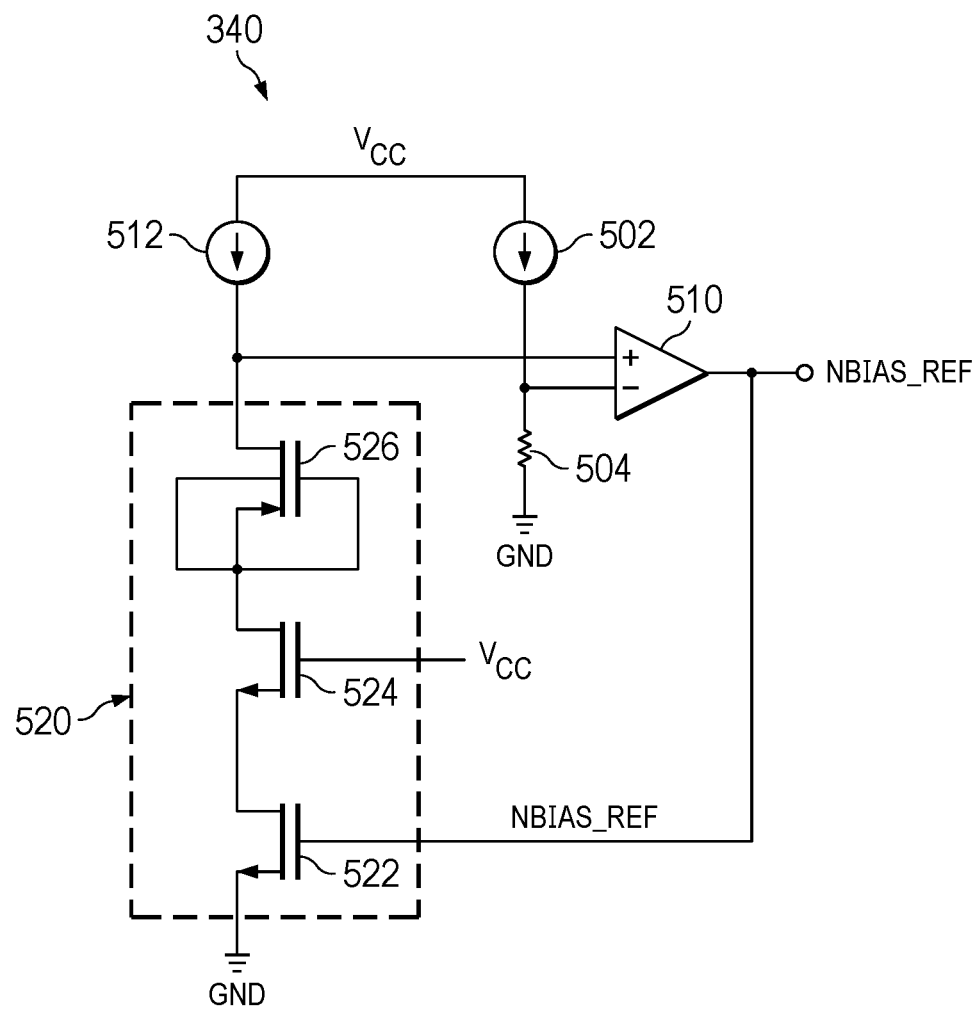
FIG. 5A is an electrical diagram, in schematic form, of a first control loop in the transmitter circuitry of FIG. 3 according to an example.

FIG. 5A illustrates the construction of an example of bias control loop 340. Bias control loop 340 includes a reference leg including current source 502 and resistor 504 coupled in series between power supply node $V_{CC}$ and circuit ground. In this example, resistor 504 may be constructed as a polysilicon resistor, or in such other construction so as to provide a low temperature coefficient. The resistance value of resistor 504 may be selected to correspond to the load resistance at bus line CANL (e.g., on the order of 250Ω). Current source 502 is configured and controlled to provide a current that follows variations in the $V_{CC}$ power supply voltage (I=$V_{CC}$/R), to minimize variations in operation of lower replica stack 520 over $V_{CC}$ variations. Operational amplifier ("op amp") 510, configured as a differential amplifier in this example, has a negative input coupled to the node between current source 502 and resistor 504.

A second leg of bias control loop 340 includes current source 512 connected in series with lower replica stack 520 between power supply node $V_{CC}$ and circuit ground. Lower replica stack 520 includes replicas of the transistors in lower driver stack 220LL (and 220HL), in the form of PMOS transistor 526, NMOS transistor 524, and NMOS transistor 522 with their source/drain paths coupled in series. More specifically, the drain of PMOS transistor 526 is coupled to current source 512 and to a positive input of op amp 510. PMOS transistor 526 is diode-connected, with its gate connected to its source (and body node) at the drain of NMOS transistor 524. NMOS transistor 524 has its gate biased at $V_{CC}$ and its source coupled to the drain of NMOS transistor 522. The source of NMOS transistor 522 is at the common potential. Op amp 510 in bias control loop 340 generates bias reference voltage NBIAS_REF at its output, which is coupled to the gate of NMOS transistor 522 and to an input of predriver 330L (FIG. 3).

Diode-connected PMOS transistor 526 in lower replica stack 520 may be constructed as a replica of diode-connected PMOS transistor 426 of lower driver stack 220LL, for example as a drain-extended PMOS transistor to match the construction of PMOS transistor 426 described above. Similarly, NMOS transistor 524 in lower replica stack 520 may be constructed as a replica of NMOS transistor 424 of lower driver stack 220LL, for example as a laterally-diffused NMOS transistor as described above for NMOS transistor 424. NMOS transistor 522 may be constructed as a low voltage transistor, to be a replica of low voltage NMOS transistor 422 in lower driver stack 220LL, as described above. To save chip area, and considering the high impedance presented at the positive input of op amp 510, the size of at least high voltage replica transistors 524, 526 in lower replica stack 520 may be significantly smaller than the corresponding transistors 424, 426 in lower driver stack 220LL, for example on the order of $1/10^{th}$ of the size.

In operation, op amp 510 in bias control loop 340 drives bias reference voltage NBIAS_REF at the gate of NMOS transistor 522 so that the voltage at its positive input, at the drain of PMOS transistor 526, matches the voltage at its negative input, in the reference leg at the node between current source 502 and resistor 504. As the on resistance $R_{on}$ of high voltage transistors 424 and 426 in lower driver stacks 220LL and 220HL varies over PVT, the on resistance $R_{on}$ of transistors 524 and 526 in lower replica stack 520 similarly varies, which modulates the voltage at the positive input of op amp 510. Op amp 510 responds by modulating bias reference voltage NBIAS_REF at its output, which changes the gate bias of transistor 522 to compensate for the $R_{on}$ variation in transistors 524 and 526. For example, if the on resistance $R_{on}$ of transistors 524 and 526 increases, op amp 510 will increase bias reference voltage NBIAS_REF to turn on NMOS transistor 522 harder, reducing its on resistance $R_{on}$ to maintain the voltage at the positive input of op amp 510 at the same voltage as produced by resistor 504 at the negative input of op amp 510. According to example embodiments, because transistors 522, 524, 526 are replicas of the devices in lower driver stack 220LL, the modulation in bias reference voltage NBIAS_REF from op amp 510 will also appear in the dominant phase at the gate of NMOS transistor 422 in lower driver stack 220LL. A reduction in the $R_{on}$ of transistors 424, 426 in lower driver stack 220LL (and lower driver stack 220HL) will have the opposite effect, causing op amp 510 in bias control loop 340 to decrease bias reference voltage NBIAS_REF, reducing the gate bias at transistors 422 and 522.

Figure 5B:
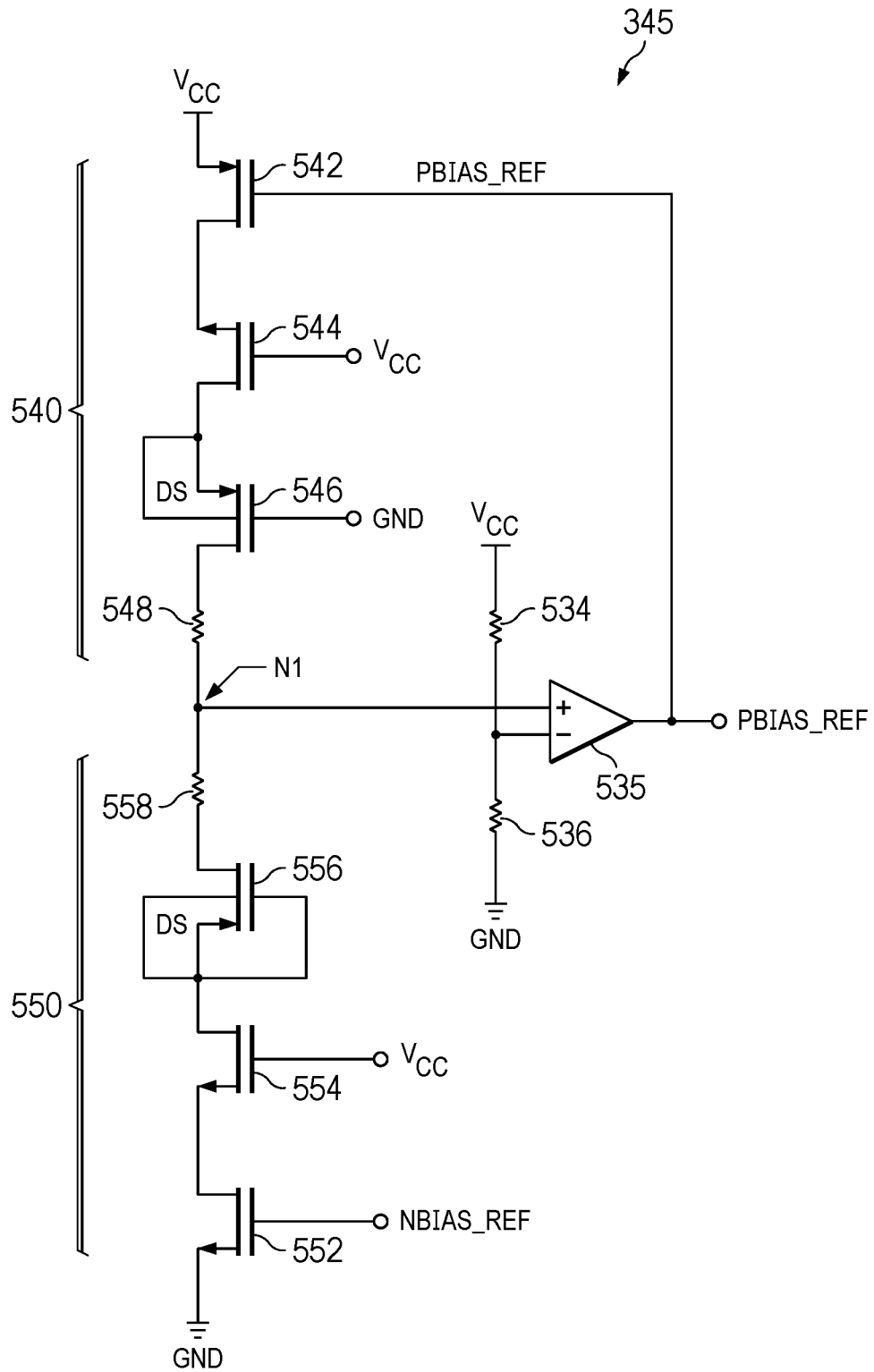
FIG. 5B is an electrical diagram, in schematic form, of a second control loop in the transmitter circuitry of FIG. 3 according to an example.

FIG. 5B illustrates the construction of VSYM control loop 345 according to an example embodiment. As will be described below, VSYM control loop 345 includes replicas of the devices in both upper driver stack 220HU and lower driver stack 220 HL (and thus of the devices in similarly-constructed upper and lower driver stacks 220LU and 220LL). VSYM control loop 345 generates and adjusts bias reference voltage PBIAS_REF to reduce variations in the voltages driven on bus lines CANH, CANL as the on resistance $R_{on}$ of devices in upper driver stacks 220HU, 220LU varies over PVT. In addition, as will also be described below, VSYM control loop 345 also includes replicas of the devices in lower driver stack 220HL (and stack 220LL), biased at bias reference voltage NBIAS_REF as generated by bias control loop 340, to maintain driver symmetry over PVT.

VSYM control loop 345 includes a reference leg including resistors 534 and 536 coupled in series between power supply node $V_{CC}$ and circuit ground. Resistors 534 and 536 may each be constructed as a polysilicon resistor or of such other material to have a low temperature coefficient. The resistance value of each of resistors 534 and 536 may be selected to match each other, and to correspond to the load resistance at bus line CANH (e.g., on the order of 250Ω each). Op amp 535, configured as a differential amplifier in this example, has a negative input coupled to the node between resistors 534 and 536. In this example in which the resistance values of resistors 534 and 536 are equal to one another, the voltage at this negative input will be substantially at a midpoint voltage between $V_{CC}$ and ground.

A second leg of VSYM control loop 345 includes upper replica stack 540 and lower replica stack 550 coupled in series between power supply node $V_{CC}$ and circuit ground. Upper replica stack 540 includes PMOS transistor 542 with its source at power supply node $V_{CC}$ and its drain coupled to the source of NMOS transistor 544. PMOS transistor 542 may be constructed as a low voltage transistor, to be a replica of low voltage PMOS transistor 402 in upper driver stack 220HU. The drain of PMOS transistor 542 is coupled to the source of NMOS transistor 546, which has its gate coupled to power supply node $V_{CC}$. NMOS transistor 544 in replica stack 540 of VSYM control loop 345 may be constructed as a replica of NMOS transistor 404 of upper driver stack 220HU, for example as a laterally-diffused NMOS transistor. The drain of NMOS transistor 544 is coupled to the source (and body node) of PMOS transistor 546, which has its gate coupled to ground. PMOS transistor 546 may be constructed as a replica of PMOS transistor 406 of upper driver stack 220HU, for example as a drain-extended PMOS transistor. The drain of PMOS transistor 546 is coupled through resistor 548 to node N1, at the positive input of op amp 535. Resistor 548 is constructed, for example as a polysilicon resistor, to match the 10X resistance value of an external load resistor (e.g., 50Ω). The gate of PMOS transistor 542 is coupled to the output of op amp 535.

Similarly, as in lower replica stack 520 of bias control loop 340, the size of at least high voltage replica transistors 544, 546 in upper replica stack 540 in VSYM control loop 345 may be significantly smaller than the corresponding transistors 404, 406 in upper driver stack 220HU, for example on the order of $1/10^{th}$ of the size.

VSYM control loop 345 further includes lower replica stack 550. In this example, lower replica stack 550 includes resistor 558 coupled in series with the source/drain paths of PMOS transistor 556, NMOS transistor 554, and NMOS transistor 552 between node N1 and circuit ground. Resistor 558 is constructed, for example as a polysilicon resistor, to match the 10X resistance value of an external load resistor (e.g., 50Ω). Transistors 552, 554, 556 in lower replica stack 550 are replicas of corresponding transistors 422, 424, 426 in lower driver stack 220LL, and in this example match the construction and size of transistors 522, 524, 526, respectively, in lower replica stack 520. As shown in FIG. 5B, PMOS transistor 556 has its drain coupled to resistor 558, and is diode-connected, with its gate connected to its source (and body node) at the drain of NMOS transistor 524. NMOS transistor 554 has its gate biased at $V_{CC}$ and its source coupled to the drain of NMOS transistor 552. The source of NMOS transistor 522 is at the common potential. The gate of NMOS transistor 522 receives bias reference voltage NBIAS_REF from the output of bias control loop 340.

In operation, op amp 535 in VSYM control loop 345 drives bias reference voltage PBIAS_REF at the gate of PMOS transistor 542 so that the voltage at its positive input, at node N1, matches the voltage at its negative input, between resistor 534, 536. In this example in which resistors 534 and 536 have the same resistance values, op amp 535 controls bias reference voltage PBIAS_REF so that the voltage at node N1 between replica stacks 540 and 550 is at the midpoint between $V_{CC}$ and ground. Because lower replica stack 550 includes replica transistors 552, 554, 556 corresponding to those in lower replica stack 520, with the gate of replica NMOS transistor 552 receiving bias reference voltage NBIAS_REF, variations in the on resistance $R_{on}$ of the high voltage devices in lower driver stack 220LL are reflected in VSYM control loop 345 at node N1. And as the on resistance $R_{on}$ of high voltage transistors 404 and 406 in upper driver stacks 220HU and 220LU varies over PVT, the on resistance $R_{on}$ of transistors 544 and 546 in upper replica stack 540 of VSYM control loop 345 similarly varies, which modulates the voltage at node N1, causing op amp 535 to modulate bias reference voltage PBIAS_REF. The gate bias at replica transistor 542 is adjusted accordingly, thus compensating for the $R_{on}$ variation in transistors 544 and 546.

Because the reference leg of resistors 534 and 536 sets a midpoint (e.g., $V_{CC}/2$) voltage at the negative input of op amp 535, and because NMOS transistor 552 in lower replica stack 550 receives bias reference voltage NBIAS_REF from bias control loop 340, VSYM control loop 345 controls the generation of bias reference voltage PBIAS_REF around that midpoint voltage to attain driver symmetry. In the context of a CAN XL network, this control of the bias reference voltages PBIAS_REF and NBIAS_REF enables transmitter circuitry 300 to satisfy the stringent driver symmetry and Von specification limits.

Alternatively, to the arrangement described above relative to FIG. 5A and FIG. 5B, the arrangement of VSYM control loop 345 and bias control loop 340 may be reversed. In such an alternative arrangement, bias control loop 340 would include an upper replica stack constructed to include replica devices of upper driver stack 220HU (e.g., in a single replica stack arrangement similar to lower replica stack 520 of FIG. 5A but with complementary devices) to generate a bias reference voltage PBIAS_REF. VSYM control loop 345 would be constructed similarly as shown in FIG. 5B but will include a replica PMOS transistor 542 receiving bias reference voltage PBIAS_REF from bias control loop 340 at its gate, to generate a bias reference voltage NBIAS_REF from op amp 535.

Figure 6A:
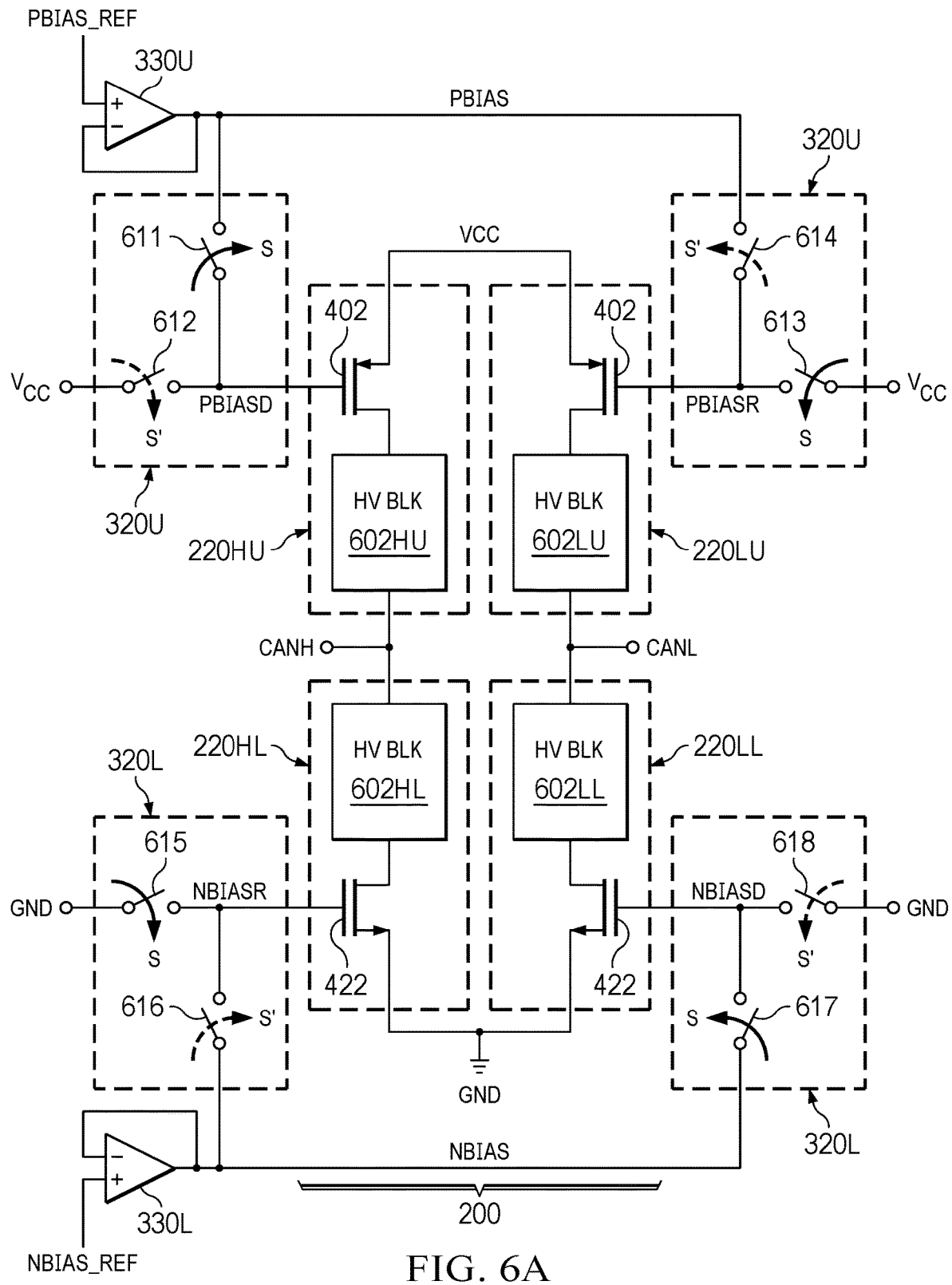
FIG. 6A is an electrical diagram, in block form, of the architecture of switching circuitry in the transmitter circuitry of FIG. 3 according to an example.

As described above relative to FIG. 3, bias reference voltage PBIAS_REF is applied to predriver 330U, which is configured to drive a corresponding bias voltage PBIAS applied to upper switching circuitry 320U. Similarly, bias reference voltage NBIAS_REF is applied to predriver 330L, which is configured to drive a corresponding bias voltage NBIAS applied to lower switching circuitry 320L. FIG. 6A illustrates, in generalized form, an arrangement of predrivers 330U, 330L and switches 320U, 320L in combination with H-bridge driver 200 including upper and lower driver stacks 220HU, 220HL, 220LU, and 220LL, according to an example embodiment.

As shown in FIG. 6A, driver stacks 220HU, 220HL, 220LU, and 220LL include high voltage blocking transistors 602HU, 602HL, 602LU, and 602LL, respectively, each of which include the positive and negative high voltage blocking transistors and diodes described above relative to FIG. 3. As such, high voltage blocking transistors 602HU and 602HL each include PMOS transistor 404 and NMOS transistor 406 as described above, in series with PMOS transistor 402. High voltage blocking transistors 602HL and 602LL each include diode-connected PMOS transistor 426 and NMOS transistor 424 as described above, in series with NMOS transistor 422.

Upper predriver 330U as shown in FIG. 6A receives bias reference voltage PBIAS_REF from VSYM control loop 345 at a positive input, and has its output coupled to its negative input. In this voltage follower configuration, upper predriver 330 is substantially a unity gain amplifier, outputting to upper switching circuitry 320U a bias voltage PBIAS based on bias reference voltage PBIAS_REF. Similarly, lower predriver 330L receives bias reference voltage NBIAS_REF from bias control loop 340 at its positive input, and has its output coupled to its negative input in a voltage follower configuration. Lower predriver 330L thus operates as substantially a unity gain amplifier, outputting to lower switching circuitry 320L, a bias voltage NBIAS based on bias reference voltage NBIAS_REF.

In the generalized arrangement of FIG. 6A, upper switching circuitry 320U includes a set of switches that operate to selectively turn PMOS transistors 402 in upper driver stacks 220HU and 220LU on and off in response to the data state to be driven at bus lines CANH, CANL. In upper switching circuitry 320U, switch 611 is coupled between the output of predriver 330U and node PBIASD at the gate of PMOS transistor 402 of upper driver stack 220HU, and switch 612 coupled between power supply node $V_{CC}$ and node PBIASD. Upper switching circuitry 320U also includes switch 613 coupled between power supply node $V_{CC}$ and node PBIASR at the gate of PMOS transistor 402 of upper driver stack 220LU, and switch 614 coupled between the output of predriver 330U and node PBIASR. Switches 611 and 613 are closed by signal S at an active state, and switches 612 and 614 are closed by signal S' at an active state. Signals S and S' are complementary to one another in this implementation, such that switches 611 and 613 are opened while switches 612 and 614 are closed, and vice versa.

Similarly, lower switching circuitry 320L includes switch 615 coupled between the common potential (circuit ground) and node NBIASR at the gate of NMOS transistor 422 of lower driver stack 220HL, and switch 616 coupled between the output of predriver 330L and node NBIASR. Lower switching circuitry 320L also includes switch 617 coupled the output of predriver 330L and node NBIASD at the gate of NMOS transistor 422 of lower driver stack 220LL, and switch 618 coupled between circuit ground and node PBIASD. Switches 615 and 617 are closed by signal S in an active state, and switches 616 and 618 are closed by signal S' in an active state. Signals S and S' are complementary to one another in this implementation, such that switches 615 and 617 are opened while switches 616 and 618 are closed, and vice versa.

Figure 6B:
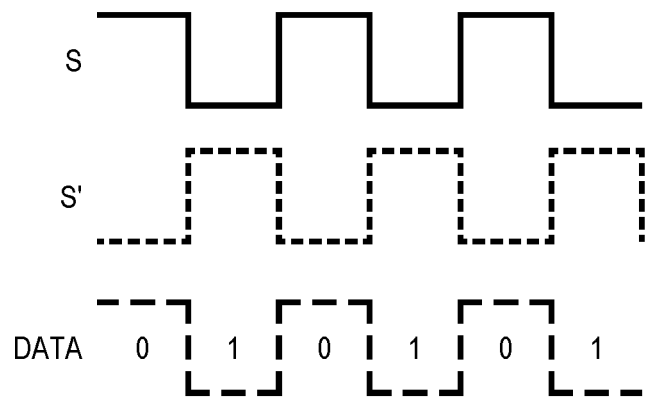
FIG. 6B is a timing diagram illustrating transitions of switching control signals in response to data levels to be transmitted according to this example.

FIG. 6B illustrates the relationship between the "0" and "1" data states to be transmitted, for example as forwarded by MCU 104 in the corresponding network node 102, and the S and S' signals applied to upper and lower switches 320U, 320L. In this example, as illustrated in FIG. 6B, for the transmission of a "0" data state, signal S is driven to an active state (e.g., a high logic level) and signal S' is driven to an inactive state (e.g., a low logic level). Conversely, for the transmission of a "1" data state, signal S is driven to an inactive state and signal S' is driven to an active state. While the "0" and "1" data states are shown in FIG. 6B as alternating cycle-by-cycle, it is understood that the particular pattern of "0" and "1" data states will depend on the data being transmitted from transmitter circuitry 300 at any particular time.

Figure 6C:
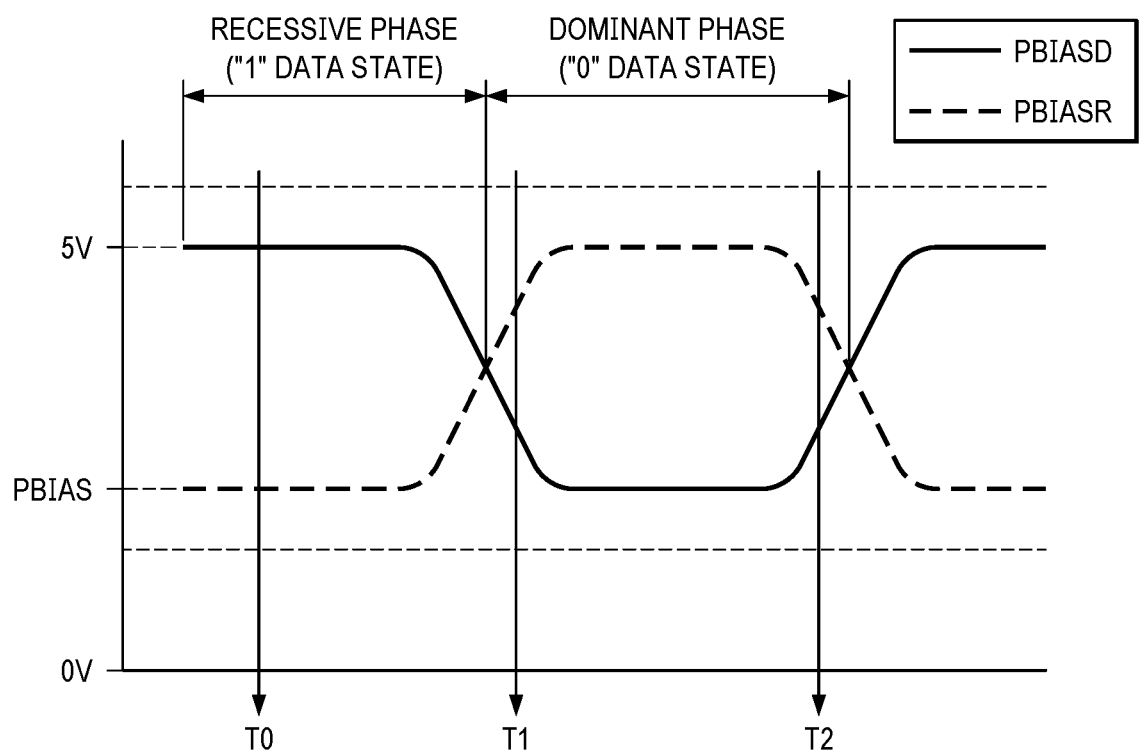
FIG. 6C is a timing diagram illustrating the application of bias voltages to bias transistors in upper driver stacks in response to the data transitions of FIG. 6B according to an example.

FIG. 6C illustrates the operation of upper switching circuitry 320U in biasing nodes PBIASD and PBIASR at the gates of transistors 402 in upper driver stacks 220HU, 220LU, respectively. In this CAN XL example, as described above relative to FIG. 1B, the dominant phase (e.g., bus line CANH at a higher voltage than bus line CANL) corresponds to transmission of a "0" data bit, and the recessive phase (e.g., bus line CANL at a higher voltage than bus line CANH) corresponds to transmission of a "1" data bit. At time T0 in the example of FIG. 6C, a "1" data state is being transmitted in the recessive phase, according to the CAN XL protocol. In this phase (referring to FIG. 6B), signal S is at an inactive state and signal S' is at an active state. Switch 612 is closed while signal S' is in its active state, closing switch 612 to couple node PBIASD to $V_{CC}$ such that transistor 402 in upper driver stack 220HU is off, turning off the high-side drive to bus line CANH. Also with signal S' in the active state, switch 614 in upper switch 302U is closed to couple node PBIASD to bias voltage PBIAS, such that PMOS transistor 402 in upper driver stack 220LU is on, causing upper driver stack 220LU to actively drive bus line CANL. During this recessive phase, switch 616 in lower switch 230L will be closed, biasing node NBIASR to bias voltage NBIAS and turning on NMOS transistor 422 in lower driver stack 220HL to drive bus line CANH; lower driver stack 220LL will be turned off by the closing of switch 618 in this recessive phase, allowing bus line CANL to be driven by upper driver stack 220LU as noted above.

In the transition from the recessive phase to the dominant phase as shown in FIG. 6C, signal S transitions to an active state (e.g., high logic level), closing switches 611 and 613 in upper switching circuitry 320U, while signal S' transitions to an inactive state (e.g., low logic level), opening switches 612 and 614. The closing of switch 611, for example, begins the charging of the gate of transistor 402 in upper driver stack 220HU toward bias voltage PBIAS, as shown at time T1 in FIG. 6C. Transistor 402 turns on as node PBIASD is charged to voltage PBIAS, enabling upper driver stack 220HU to drive bus line CANH. Conversely, the closing of switch 613 in upper switching circuitry 320U begins the discharging of the gate of PMOS transistor 402 in upper driver stack 220LU to power supply node $V_{CC}$, also at this time T1, turning off PMOS transistor 402. Accordingly, switches 611 and 614 in upper switching circuitry 320U can be referred to as "charging switches" and switches 612 and 613 can be referred to as "discharging switches."

Similarly for the transition from the dominant phase to the recessive phase, charging switch 614 and discharging switch 612 will close (signal S' going to an active state). During that transition, which includes time T2 in FIG. 6C, the gate of PMOS transistor 402 in upper driver stack 220LU will charge toward bias voltage PBIAS while the gate of PMOS transistor 402 will discharge to power supply node $V_{CC}$. As a result, upper driver stack 220LU will drive bus line CANL in the recessive phase, while upper driver stack 220HU will be turned off (allowing lower driver stack 220HL to drive bus line CANH).

Lower switching circuitry 320L will operate in the same manner in the dominant and recessive phases as described above for upper switching circuitry 320U, but in a complementary manner so that lower driver stack 220HL is enabled to drive bus line CANH while upper driver stack 220HU is disabled (by its transistor 402 being off), and lower driver stack 220LL is enabled to drive bus line CANL while upper driver stack 220LU is disabled.

Figure 7:
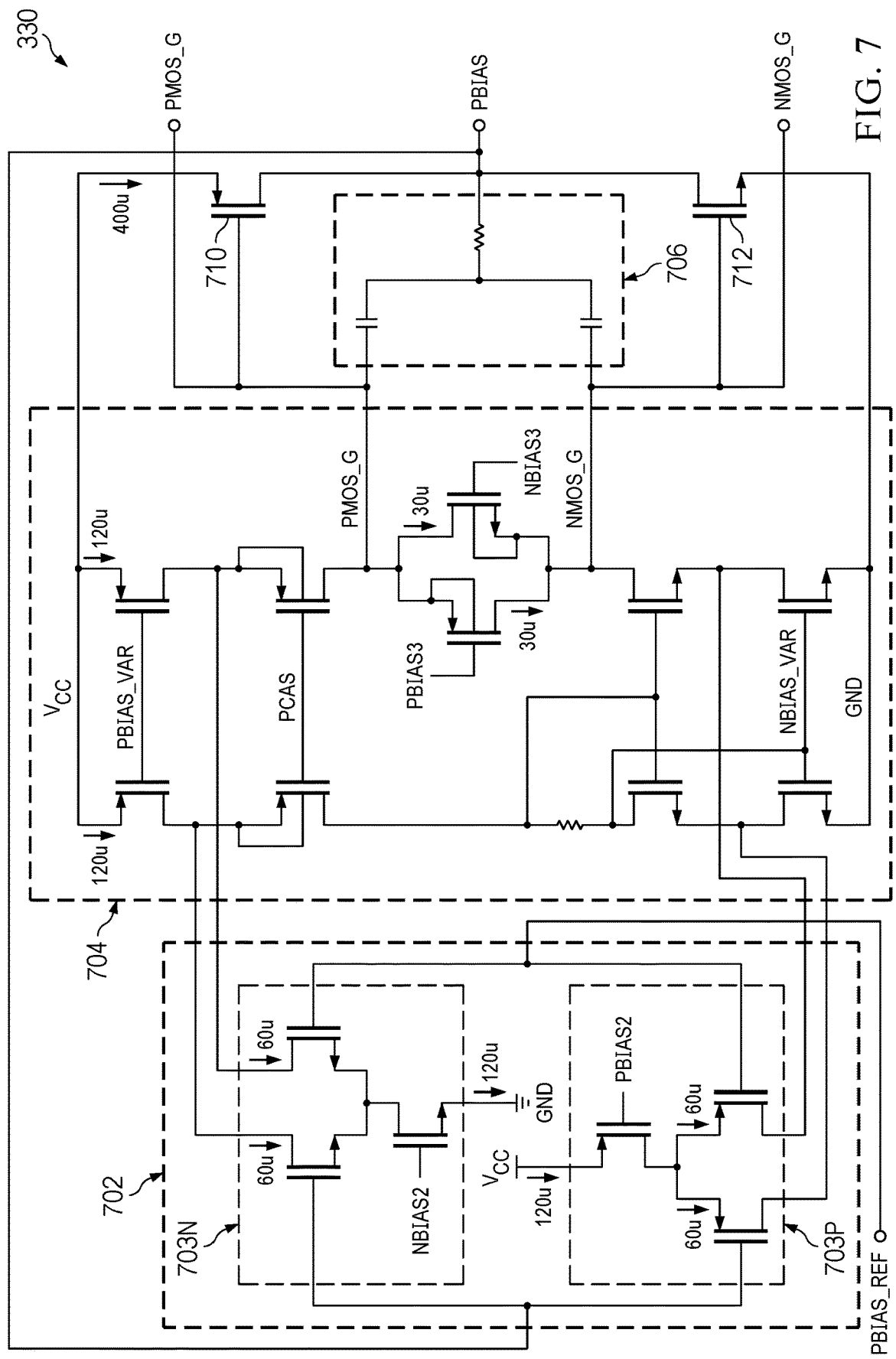
FIG. 7 is an electrical diagram, in schematic form, of predriver circuitry in the transmitter circuitry of FIG. 3 according to an example.

According to an example embodiment, each of predrivers 330U, 330L (individually and collectively referred to as predriver(s) 330) is constructed as a high speed amplifier with a "Class AB" output stage. FIG. 7 illustrates the construction of one implementation of predriver 330U in the architecture of FIG. 6A according to that example embodiment; predriver 330L may be similarly constructed. While FIG. 7 includes a transistor-level illustration, the following description will describe predriver 330U with reference to various subcircuits into which those transistors are arranged. It is to be understood that the particular implementation shown in FIG. 7 is by way of example only, and that predrivers 330 may be implemented according to other circuit arrangements (including different transistor-level circuits and subcircuits). Nominal currents as conducted by particular transistors in predriver 330U are shown in FIG. 7 by way of example, it being further understood that these current levels may vary in different implementations and applications as appropriate.

Predriver 330U in the example of FIG. 7 includes differential input stage 702 constructed of complementary NMOS and PMOS differential stages 703N and 703P, respectively. For this case of predriver 330U, differential stages 703N and 703P each receive bias reference voltage PBIAS_REF at one input (the positive input, in this example), and bias voltage PBIAS from the output of predriver 330U itself at another input (the negative input). NMOS differential stage 703N and PMOS differential stage 703P receive bias voltage NBIAS2 and PBIAS2, respectively; these and other bias voltages illustrated in FIG. 7 correspond to various bias voltages as may be generated by reference voltage circuitry (not shown) elsewhere in transceiver 110, at levels appropriate for the particular implementation. In the example of FIG. 7, this construction of differential input stage 702 provides predrivers 330 with a rail-to-rail input voltage range to accommodate large movement of bias reference voltages PBIAS and NBIAS (as the case may be) from VSYM control loop 345 and bias control loop 340, respectively, as the on resistance $R_{on}$ of the high voltage devices in driver stages 220 varies across PVT.

In this implementation, predriver 330U further includes level shift stage 704 coupled to differential input stage 702. Level shift stage 704 receives differential currents from NMOS differential stage 703N and PMOS differential stage 703P based on the differential input voltage applied to differential input stage 702, and in response generates output gate voltages PMOS_G and NMOS_G applied to the gates of output drive transistors 710 and 712, respectively.

Pull-up output transistor 710 is a PMOS transistor with its source at power supply node $V_{CC}$ and its drain coupled to the drain of pull-down output transistor 712 at the output of predriver 330U. Pull-down output transistor 712 is an NMOS transistor with its source at the common potential (e.g., circuit ground). Accordingly, output transistors 710 and 712 are arranged as a push-pull output stage of predriver 330U, and drive bias voltage PBIAS at their common drain node in response to the gate voltages PMOS_G and NMOS_G, respectively, as output by level shift stage 704. Bias voltage PBIAS at the output of predriver 330U is fed back to the negative input of predriver 330U at input differential stage 702, as noted above. This direct feedback results in predriver 330U providing unity gain, such that the bias voltage PBIAS output by predriver 330U substantially matches bias reference voltage PBIAS_REF as generated by VSYM control loop 345.

Miller compensation network 706, including parallel capacitors and a series resistor, is coupled between the outputs of level shift stage 704 (PMOS_G and NMOS_G) and the output of predriver 330U (PBIAS), to compensate for Miller effect on the amplifier performance.

In this implementation, output transistors 710 and 712 are constructed to support high drive currents (e.g., having relatively large channel width/length ratios), sufficient to drive H-bridge driver 200 via upper switching circuitry 320U at the desired high speeds (e.g., data rates≥15 Mbps) in both phases. Furthermore, the output stage of output transistors 710 and 712 in predriver 330U according to this configuration operates as a "Class AB" output stage which, in this application, presents lower output resistance to both of the high and low sides to address coupling to low voltage gate nets during direct power injection (DPI).

As also noted above, predriver 330L may be constructed to be substantially identical to predriver 330U of FIG. 7, to produce bias voltage NBIAS based on bias reference voltage NBIAS_REF generated by bias control loop 340. The close matching of predrivers 330L and 330U with one another reduces the possibility of mismatch in the upper and lower signal paths, facilitating symmetry in the signals output by transmitter circuitry 300.

According to an example embodiment, each of upper and lower switches 320U and 320L, respectively, are configured so that the charging and discharging currents applied to the gates of the operative transistors in driver stacks 220HU, 220HL, 220LU, 220LL, are symmetric. More specifically, upper switching circuitry 320U is arranged to charge the gate of PMOS transistors 402 in upper driver stacks 220HU, 220LU from bias voltage PBIAS output by predriver 330U, and to discharge the gate of those PMOS transistors 402 with a current based on gate voltage NMOS_G applied to output driver transistor 712 in predriver 330U. Furthermore, upper switching circuitry 320U is configured to include compensation for temperature variations in its control of the discharging current. Lower switching circuitry 320L is similarly arranged to charge NMOS transistors 422 in lower driver stacks 220HL, 220LL from bias voltage NBIAS output by predriver 330L, and to discharge those NMOS transistors 422 with a current based on gate voltage PMOS_G applied to output driver transistor 710 in predriver 330L, compensated for temperature.

Figure 8A:
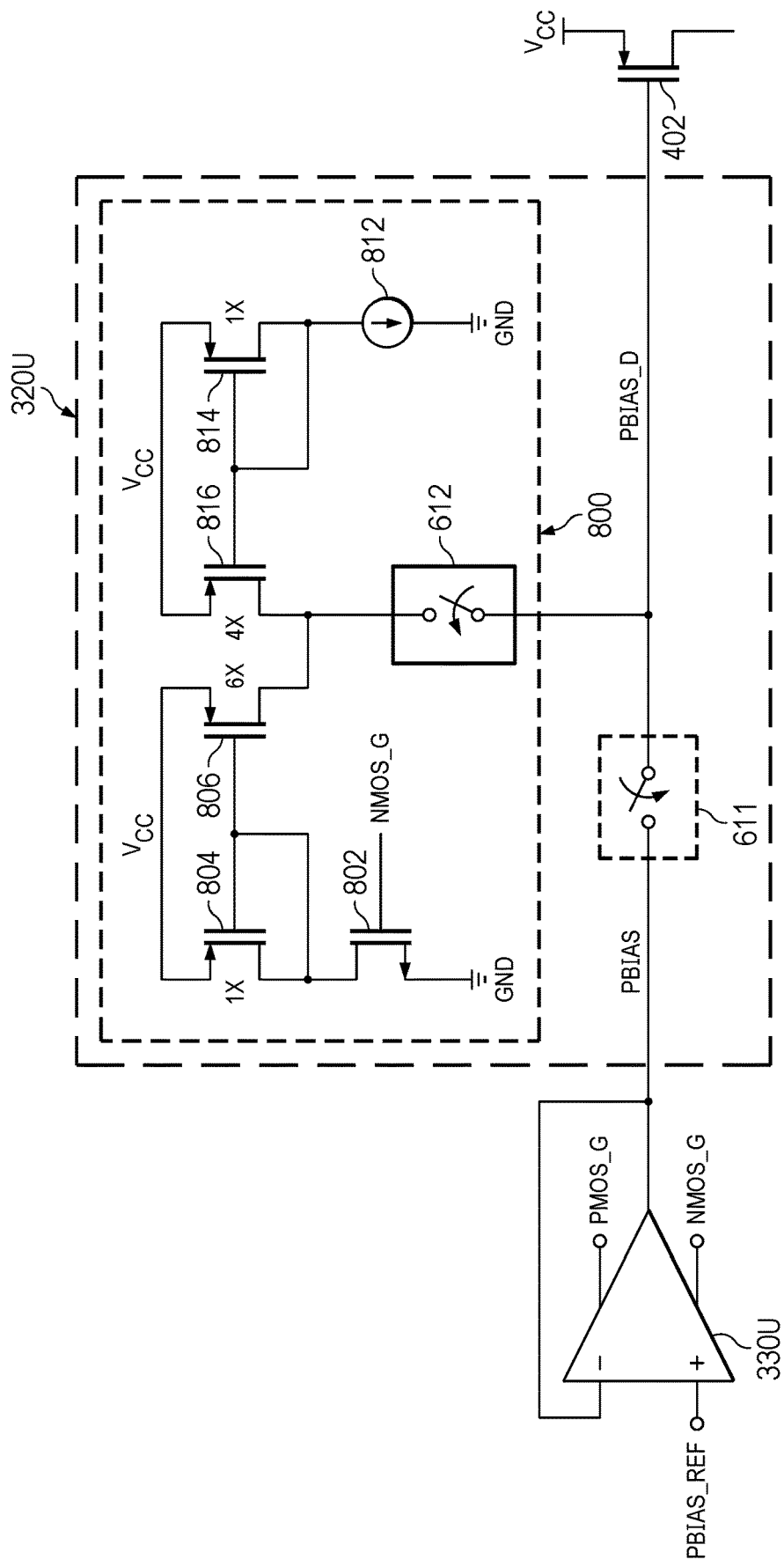
FIG. 8A is an electrical diagram, in schematic form, of upper switching circuitry in the transmitter circuitry of FIG. 3 according to an example.

FIG. 8A illustrates the construction of upper switching circuitry 320U according to an example embodiment. As shown in FIG. 8A, predriver 330U receives bias reference voltage PBIAS_REF at a positive input, and generates bias voltage PBIAS at its output, which is applied to switch 611. Switch 611 opens and closes in response to the data signal to be transmitted by transmitter circuitry 300 (e.g., as may be provided by MCU 104 of FIG. 1A), and when closed couples bias voltage PBIAS at node PBIAS_D to the gate of PMOS transistor 402 in upper driver stack 220HU. Switch 612, which in the example of FIG. 8A is included as part of discharging circuit 800, is also coupled to node PBIAS_D at the gate of transistor 402 of upper driver stack 220HU. While not shown in FIG. 8A for the sake of clarity, switches 613 and 614 are coupled in parallel with switches 611 and 612, respectively, as shown in FIG. 6, to charge and discharge the gate of PMOS transistor 402 in upper driver stack 220LU in a similar manner. In this configuration, parallel switch 614 may also be included as part of discharging circuit 800.

Discharging circuit 800 in this implementation includes two current mirrors that operate to split the discharging current from the gate of transistor 402 through switch 612 to $V_{CC}$. In a first one of these current mirrors, NMOS transistor 802 has its source at circuit ground, and its gate receiving gate voltage NMOS_G from predriver 330U. The drain of transistor 802 is coupled to the gate and drain of PMOS transistor 804, and to the gate of PMOS transistor 806. The sources of PMOS transistors 804 and 806 are coupled to power supply node $V_{CC}$, and the drain of transistor 806 is coupled to switch 612. In this example, PMOS transistor 806 is sized larger (e.g., has a larger W/L ratio) than transistor 804, for example by a multiple of six.

A second current mirror in discharging circuit 800 includes current source 812, coupled between circuit ground and the gate and drain of PMOS transistor 814 and gate of PMOS transistor 816. Current source 812 is constructed to have a characteristic proportional to absolute temperature (PTAT). PMOS transistor 814 has its drain coupled to switch 612, and its source at power supply node $V_{CC}$. In this example, transistor 814 is constructed to have the same size as transistor 804, and transistor 816 is larger (e.g., larger W/L) than transistor 814, for example by a multiple of four.

In operation, the closing of switch 612 operates to discharge the gate-to-source capacitance of PMOS transistor 402 by coupling it to the $V_{CC}$ power supply (at which the source of transistor 402 is coupled). The discharge current through switch 612 is split by transistors 806 and 816, according to the currents set by NMOS transistor 802 and current source 812, respectively, and according to the relative sizes of the PMOS transistors 804, 806, 814, 816. In the example described above relative to FIG. 8A in which transistors 804 and 814 are the same size, and transistors 806 and 816 are 6× and 4×, respectively, the size of transistors 804 and 814, approximately 60% of the discharge current through switch 612 would conduct through transistor 806 and 40% through transistor 816.

This construction of upper switching circuitry 320U provides important advantages in the temperature stability and symmetry of transmitter circuitry 300. In this example, the current that charged the gate-to-source capacitance of PMOS transistor 402 in upper driver stack 220HU or 220LU (depending on the data state) is largely driven by NMOS output drive transistor 712 in predriver 330U. The same gate voltage NMOS_G applied to that transistor 712 is applied to the gate of NMOS transistor 802 of upper switching circuitry 320L, such that the discharge current of the gate-to-source capacitance of PMOS transistor 402 matches the charging current from predriver 330U. In addition, according to the example of FIG. 8A, PTAT current source 812 also is also a factor controlling the discharge current through switch 612, reducing temperature-dependent variation in the discharge current. Furthermore, it has been observed that the presence of the second current mirror based on PTAT current source 812 also compensates for the effects, on the discharge current, of any mismatch in the drain-to-source voltage between the output stage of predriver 330U and discharging circuit 800.

Figure 8B:
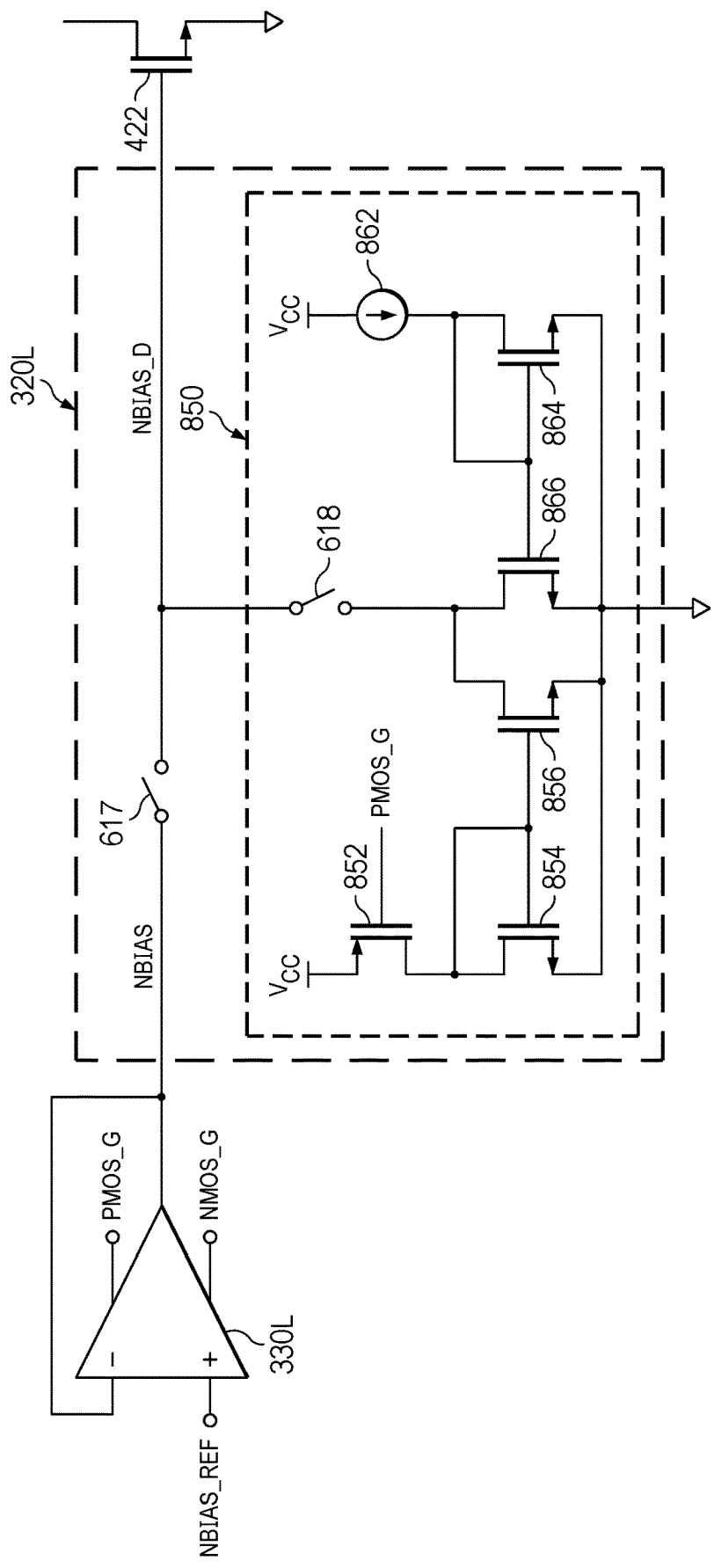
FIG. 8B is an electrical diagram, in schematic form, of lower switching circuitry in the transmitter circuitry of FIG. 3 according to an example.

Lower switching circuitry 320L is constructed similarly but complementary relative to upper switching circuitry 320U, in that it operates to charge and discharge the gate of NMOS transistors 422 in lower driver stacks 220HL, 220LL (as opposed to PMOS transistors 402). FIG. 8B illustrates an example of the construction of lower switching circuitry 320L in this complementary arrangement. Predriver 330U receives bias reference voltage NBIAS_REF at a positive input, and generates bias voltage NBIAS at its output to switch 617, which opens and closes in response to the data signal to be transmitted by transmitter circuitry 300 (e.g., as provided by MCU 104 of FIG. 1A). When closed, switch 617 couples bias voltage NBIAS at node NBIAS_D to the gate of NMOS transistor 422 in lower driver stack 220LL, charging the gate-to-source capacitance of transistor 422. Discharging circuit 850 includes switch 618 coupled to node NBIAS_D, and thus coupled to the gate of NMOS transistor 422 of upper driver stack 220LL. Similarly, switches 616 and 615 (not shown in FIG. 8B) are coupled in parallel with switches 617 and 618, respectively, as shown in FIG. 6, to charge and discharge the gate of NMOS transistor 422 in lower driver stack 220LL in a similar manner. In this configuration, parallel switch 616 may also be included as part of discharging circuit 850.

Discharging circuit 850 as shown in FIG. 9B includes two current mirrors that operate to split the discharging current from the gate of transistor 422 through switch 618 to ground. In one current mirror, PMOS transistor 852 has source at power supply node $V_{CC}$, and its gate receiving gate voltage PMOS_G from predriver 330L. The drain of transistor 852 is coupled to the gate and drain of NMOS transistor 854, and to the gate of PMOS transistor 856. The sources of NMOS transistors 854 and 856 are coupled to ground, and the drain of transistor 856 is coupled to switch 618. In this example, NMOS transistor 806 is sized larger (e.g., has a larger W/L ratio) than transistor 854, for example by a multiple of six.

A second current mirror in discharging circuit 850 includes current source 862, coupled between $V_{CC}$ and the gate and drain of NMOS transistor 864 and gate of NMOS transistor 866. Current source 862 is constructed to have a characteristic proportional to absolute temperature (PTAT). NMOS transistor 864 has its drain coupled to switch 618, and its source at ground, and in this example is constructed to have the same size as transistor 854. NMOS transistor 866 is constructed to be larger (e.g., has a larger W/L) than transistor 864, for example by a multiple of four.

In the operation of discharging circuit 850, the closing of switch 618 discharges the gate-to-source capacitance of NMOS transistor 422 by coupling it to circuit ground. The discharge current through switch 618 is split by transistors 856 and 866, according to the currents set by PMOS transistor 852 and current source 862, respectively, and according to the relative sizes of the PMOS transistors 854, 856, 864, 866. In this example in which transistors 854 and 864 are the same size, and transistors 856 and 866 are 6× and 4×, respectively, the size of transistors 854 and 864, approximately 60% of the discharge current through switch 618 would conduct through transistor 856 and 40% through transistor 866.

This construction of lower switching circuitry 320L provides similar advantages, from the standpoint of temperature stability and symmetry, as described above in connection with upper switching circuitry 320U. As described above, the charging current provided by predriver 330L is matched in the discharge current through switch 618, which is based on the bias of PMOS transistor 852 by gate bias voltage PMOS_G from predriver 330L. In addition, the PTAT characteristic of current source 812 reduces temperature-dependent variation in this discharge current, and compensates for the effects of mismatch in the drain-to-source voltage between the output stage of predriver 330L and discharging circuit 850.

Numerous benefits can be realized from the various features of the transmitter circuitry of the examples described above. By controlling the bias voltages applied to the driver stacks based on replicas of the driver stacks, variation in the on resistance $R_{on}$ of the driver stack high voltage blocking devices can be compensated, avoiding the need for large driver blocking transistors and thus reducing the capacitive loading on the bus lines. In the example described above, this bias voltage control can be attained with good stability and close driver symmetry over PVT, enabling the transmitter to meet stringent specification limits, such as those of the CAN XL standard.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are:

(i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. Transmitter circuitry for differential signaling, comprising:
   first and second terminals adapted to be coupled to first and second lines of a network bus;
   an upper driver stack comprising:
      an upper bias transistor, having a source/drain path and a gate, the source/drain path coupled to a supply node; and
      at least one upper blocking transistor coupled in series with the source/drain path of the upper bias transistor;
   a lower driver stack comprising:
      a lower bias transistor, having a source/drain path and a gate; and
      at least one lower blocking transistor coupled in series with the source/drain path of the lower bias transistor and coupled to a common node;
   a first control loop comprising:
      a first replica stack including replicas of the bias transistor and at least one blocking transistor in a first one of the upper and lower driver stacks, coupled in series;
      a first reference leg coupled between the supply node and the common node; and
      a first differential amplifier having a first input coupled to the first replica stack, a second input coupled to the first reference leg, and an output coupled to a gate of the replica bias transistor in the first replica stack;
   a second control loop comprising:
      a second replica stack including replicas of the bias transistor and at least one blocking transistor in a second one of the upper and lower driver stacks, coupled in series;
      a third replica stack including replicas of the bias transistor and at least one blocking transistor in the first one of the upper and lower driver stacks, the third replica stack coupled to the second replica stack at an output node and in series with the second replica stack, the replica bias transistor in the third replica stack having a gate coupled to the output of the first differential amplifier;
      a second reference leg coupled between the supply node and the common node; and
      a second differential amplifier having a first input coupled to the output node, a second input coupled to the output node, and an output coupled to a gate of the replica bias transistor in the second replica stack;
   first switching circuitry configured to couple the output of the first differential amplifier to the gate of the bias transistor of the first one of the upper and lower driver stacks responsive to a data signal; and
   second switching circuitry configured to couple the output of the second differential amplifier is coupled to the gate of the bias transistor of the second one of the upper and lower driver stacks responsive to the data signal.

2. The transmitter circuitry of claim 1, wherein the source/drain path of the upper bias transistor is coupled to the supply node;
   wherein the at least one upper blocking transistor comprise:
      an upper positive voltage blocking transistor of a first conductivity type; and
      an upper negative voltage blocking transistor of a second conductivity type, connected in series with the upper positive blocking transistor;
   wherein the source/drain path of the lower bias transistor is coupled to the common node;
   and wherein the at least one lower blocking transistor comprises:
      a lower positive voltage blocking transistor of the first conductivity type; and
      a lower negative voltage blocking transistor of the second conductivity type, connected in series with the lower positive blocking transistor.

3. The transmitter circuitry of claim 2, wherein the lower positive blocking transistor comprises a metal-oxide-semiconductor (MOS) transistor having a drain coupled to the second terminal, and a source and a gate both coupled to the source/drain path of the lower negative voltage blocking transistor;
   and wherein the first conductivity type is p-channel and the second conductivity type is n-channel.

4. The transmitter circuitry of claim 3, wherein each of the blocking transistors comprises a high voltage MOS transistor.

5. The transmitter circuitry of claim 4, wherein each of the replica bias transistors comprises a MOS transistor of a size smaller than its corresponding bias transistor and each of the replica blocking transistors comprises a MOS transistor of a size smaller than its corresponding blocking transistor.

6. The transmitter circuitry of claim 1, wherein each of the first and third replica stacks includes replicas of the lower bias transistor and at least one lower blocking transistor of the lower driver stack;
   and wherein the second replica stack includes replicas of the upper bias transistor and at least one upper blocking transistor of the upper driver stack.

7. The transmitter circuitry of claim 6, wherein the first switching circuitry comprises:

a first upper charging switch coupled between the output of the second differential amplifier and the gate of the upper bias transistor; and
a first upper discharging switch coupled between the supply node and the gate of the upper bias transistor;
and wherein the second switching circuitry comprises:
a first lower charging switch coupled between the output of the first differential amplifier and the gate of the lower bias transistor; and
a first lower discharging switch coupled between the supply node and the gate of the lower bias transistor;
wherein the first upper and first lower charging and discharging switches are coupled to data circuitry to open and close in response to transmit data signals.

8. The transmitter circuitry of claim 7, further comprising:
an upper output stage amplifier having an input coupled to the output of the second differential amplifier and an output coupled to the first upper charging switch; and
a lower output stage amplifier having an input coupled to the output of the first differential amplifier and an output coupled to the first lower charging switch.

9. The transmitter circuitry of claim 8, wherein the upper output stage amplifier comprises:
a first pull-up transistor having a source/drain path coupled between the supply node and the output of the upper output stage amplifier, and having a gate;
a first pull-down transistor having a source/drain path coupled between the common node and the output of the upper output stage amplifier, and having a gate;
a first amplifier stage having an input coupled to the output of the second differential amplifier, and configured to bias the gates of the first pull-up and pull-down transistors;
and wherein the first switching circuitry comprises:
a discharging circuit coupled between the supply node and the first upper discharging switch, and configured to control a discharging current to the gate of the upper bias transistor responsive to bias applied by the first amplifier stage to first pull-down transistor of the upper output stage amplifier.

10. The transmitter circuitry of claim 1, wherein the upper driver stack is a first upper driver stack and the lower driver stack is a first lower driver stack;
the transmitter circuitry further comprising:
a second upper driver stack comprising:
an upper bias transistor, having a source/drain path and a gate, the source/drain path coupled to a supply node;
at least one upper blocking transistor coupled in series with the source/drain path of the upper bias transistor; and
a second lower driver stack, comprising:
a lower bias transistor, having a source/drain path and a gate;
at least one lower blocking transistor coupled in series with the source/drain path of the lower bias transistor;
wherein the first switching circuitry is configured to couple the output of the first differential amplifier to the gate of the bias transistor of the first upper and second lower driver stacks responsive to the data signal;
and wherein the second switching circuitry is configured to couple the output of the second differential amplifier to the gate of the bias transistor of the second upper and first lower driver stacks responsive to the data signal.

11. The transmitter circuitry of claim 1, wherein each of the first and third replica stacks includes replicas of the upper bias transistor and at least one upper blocking transistor of the upper driver stack;
and wherein the second replica stack includes replicas of the lower bias transistor and at least one lower blocking transistor of the lower driver stack.

12. Differential signaling transmitter circuitry comprising:
a first driver stack including a first bias transistor having a source/drain path coupled to a first terminal in series with the source/drain path of at least one first blocking transistor in the first driver stack;
a second driver stack including a second bias transistor having a source/drain path coupled to a second terminal in series with the source/drain path of at least one first blocking transistor in the second driver stack;
first replica circuitry adapted to generate a first bias reference voltage by controlling a gate voltage of a replica of the first bias transistor in a first replica stack, the first replica stack including a replica of the first bias transistor and a replica of the at least one first blocking transistor in the first driver stack; and
second replica circuitry adapted to generate a second bias reference voltage by controlling a gate voltage of a replica of the second bias transistor in a second replica stack, the second replica stack including the replica of the second bias transistor and replicas of the at least one first blocking transistor in the second driver stack, the second replica stack coupled in series with a third replica stack including replicas of the first bias transistor and a replica of the at least one first blocking transistor in the first driver stack, the gate of the replica of the first bias transistor in the third replica stack receiving the gate voltage controlled by the first replica circuitry;
first switching circuitry adapted to couple a first gate voltage corresponding to the first bias reference voltage to the gate of the first bias transistor in the first driver stack responsive to a data signal; and
second switching circuitry adapted to couple a second gate voltage corresponding to the second bias reference voltage to the gate of the second bias transistor in the second driver stack responsive to the data signal.

13. The transmitter circuitry of claim 12, wherein the first and second switching circuitry are adapted to couple the first and second gate voltages to the gates of the first and second bias transistors, respectively, responsive to the data signal at a first level;
wherein the first switching circuitry is adapted to couple the first gate voltage to the gate of a third bias transistor in a third driver stack, the third bias transistor having a source/drain path coupled to the first terminal in series with the source/drain path of at least one third blocking transistor in the third driver stack responsive to the data signal at a second level;
and wherein the second switching circuitry is adapted to couple the second gate voltage to the gate of a fourth bias transistor in a fourth driver stack, the fourth bias transistor having a source/drain path coupled to the second terminal in series with the source/drain path of at least one fourth blocking transistor in the fourth driver stack responsive to the data signal at the second level.

14. The transmitter circuitry of claim 13, wherein each of the first and third driver stacks is coupled between the first terminal and a power supply node;

and wherein each of the second and fourth driver stacks is coupled between the second terminal and a common potential node.

15. The transmitter circuitry of claim 12, wherein the at least one first blocking transistor includes:
a first positive blocking transistor formed of a p-channel metal-oxide-semiconductor (MOS) transistor, and having a drain coupled to the first terminal, and a source and a gate;
a first negative blocking transistor formed of an n-channel MOS transistor, having a drain coupled to the source of the first positive blocking transistor, and a source coupled to the source/drain path of the first bias transistor; and wherein the at least one second blocking transistor includes:
a second negative blocking transistor formed of a p-channel MOS transistor, having a drain coupled to the second terminal, and a source and a gate coupled together;
a second positive blocking transistor formed of an n-channel MOS transistor, having a drain coupled to the source and gate of the first negative blocking transistor, and a source coupled to the source/drain path of the second bias transistor.

16. The transmitter circuitry of claim 12, wherein the first and second switching circuitry are adapted to couple the first and second gate voltages to the gates of the first and second bias transistors, respectively, responsive to the data signal at a first level;
the transmitter circuitry further comprising:
a first predriver including a first push-pull output stage, the first predriver adapted to output the first gate voltage responsive to the first bias reference voltage;
a second predriver including a second push-pull output stage, the second predriver adapted to output the second gate voltage responsive to the second bias reference voltage;
wherein the first switching circuitry is further adapted to, responsive to the data signal at a second level, discharge the gate of the first bias transistor with a discharging current corresponding to a pull-down current conducted in the first push-pull output stage;
and wherein the second switching circuitry is further adapted to, responsive to the data signal at a second level, discharge the gate of the second bias transistor with a discharging current corresponding to a pull-down current conducted in the second push-pull output stage.

17. A network node comprising:
a microcontroller unit (MCU);
first and second terminals, adapted to be coupled to first and second lines of a network bus;
receiver circuitry, coupled to the first and second terminals, and configured to receive signals on the network bus for forwarding to the MCU; and
transmitter circuitry, coupled to the first and second terminals, and configured to transmit signals onto the network bus responsive to data signals from the MCU, the transmitter circuitry comprising:
an upper driver stack comprising:
an upper bias transistor, having a source/drain path and a gate, the source/drain path coupled to a supply node;
at least one upper blocking transistor coupled in series with the source/drain path of the upper bias transistor;
a lower driver stack, comprising:
a lower bias transistor, having a source/drain path and a gate; and
at least one lower blocking transistor coupled in series with the source/drain path of the lower bias transistor and coupled to a common node;
a first control loop comprising:
a first replica stack including replicas of the bias transistor and at least one blocking transistor in a first one of the upper and lower driver stacks, coupled in series;
a first reference leg coupled between the supply node and the common node; and
a first differential amplifier having a first input coupled to the first replica stack, a second input coupled to the first reference leg, and an output coupled to a gate of the replica bias transistor in the first replica stack;
a second control loop comprising:
a second replica stack including replicas of the bias transistor and at least one blocking transistor in a second one of the upper and lower driver stacks, coupled in series between the supply node and the common node;
a third replica stack including replicas of the bias transistor and at least one blocking transistor in the first one of the upper and lower driver stacks, the third replica stack coupled to the second replica stack at an output node and in series with the second replica stack between the supply node and the common node, the replica bias transistor in the third replica stack having a gate coupled to the output of the first differential amplifier;
a second reference leg coupled between the supply node and the common node; and
a second differential amplifier having a first input coupled to the output node, a second input coupled to the output node, and an output coupled to a gate of the replica bias transistor in the second replica stack;
first switching circuitry configured to couple the output of the first differential amplifier to the gate of the bias transistor of the first one of the upper and lower driver stacks responsive to a data signal; and
second switching circuitry configured to couple the output of the second differential amplifier is coupled to the gate of the bias transistor of the second one of the upper and lower driver stacks responsive to the data signal.

18. The network node of claim 17, wherein the source/drain path of the upper bias transistor is coupled to the supply node;
wherein the at least one upper blocking transistor comprise:
an upper positive high voltage blocking metal-oxide-semiconductor (MOS) transistor of a first conductivity type; and
an upper negative high voltage blocking MOS transistor of a second conductivity type, connected in series with the upper positive blocking transistor between the first terminal and the source/drain path of the upper bias transistor;
wherein the source/drain path of the lower bias transistor is coupled to the common node;
and wherein the at least one lower blocking transistor comprises:
a lower positive high voltage blocking MOS transistor of the first conductivity type; and a lower negative high voltage blocking MOS transistor of the second conductivity type, connected in series with the lower positive blocking transistor between the second terminal and the source/drain path of the lower bias transistor.

19. The network node of claim 18, wherein the lower positive high voltage blocking MOS transistor has a drain coupled to the second terminal, and a source and a gate both coupled to the source/drain path of the lower negative blocking MOS high voltage transistor;

and wherein the first conductivity type is p-channel and the second conductivity type is n-channel.

20. The network node of claim 17, wherein each of the replica bias transistors comprises a MOS transistor of a size smaller than its corresponding bias transistor and each of the replica blocking transistors comprises a MOS transistor of a size smaller than its corresponding blocking transistor.

\* \* \* \* \*